United States Patent
Sekiya

(10) Patent No.: US 10,974,359 B2
(45) Date of Patent: Apr. 13, 2021

(54) AUTOMATED WORKPIECE CONVEYING VEHICLE

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 173 days.

(21) Appl. No.: 16/509,781

(22) Filed: Jul. 12, 2019

(65) Prior Publication Data
US 2020/0023484 A1    Jan. 23, 2020

(30) Foreign Application Priority Data
Jul. 18, 2018    (JP) .............................. JP2018-135227

(51) Int. Cl.
| | | |
|---|---|---|
| *B23Q 15/22* | (2006.01) | |
| *B23Q 1/64* | (2006.01) | |
| *H01L 21/677* | (2006.01) | |

(52) U.S. Cl.
CPC ............... *B23Q 15/22* (2013.01); *B23Q 1/64* (2013.01); *H01L 21/6773* (2013.01); *H01L 21/67724* (2013.01); *H01L 21/67736* (2013.01)

(58) Field of Classification Search
CPC .......... H01L 21/67724; H01L 21/6773; H01L 21/67736; B23Q 15/22; B23Q 1/64
See application file for complete search history.

(56) References Cited

U.S. PATENT DOCUMENTS

| | | | | |
|---|---|---|---|---|
| 4,368,438 A | * | 1/1983 | Stienstra ................ | B65H 7/125 310/336 |
| 5,213,176 A | * | 5/1993 | Oroku .................. | B60B 19/003 180/168 |
| 5,761,940 A | * | 6/1998 | Moore, Jr. ........... | B23Q 17/225 72/19.4 |
| 6,301,967 B1 | * | 10/2001 | Donskoy .............. | G01N 29/045 73/579 |
| 6,333,701 B1 | * | 12/2001 | Mee ......................... | G08G 1/07 340/683 |
| 7,936,266 B2 | * | 5/2011 | Francis ................. | G09F 3/0352 340/545.1 |
| 2003/0053089 A1 | * | 3/2003 | Nojiri ................ | G01N 29/4427 358/1.9 |
| 2003/0123944 A1 | * | 7/2003 | Lanvin ................. | B23Q 1/4814 409/172 |

(Continued)

FOREIGN PATENT DOCUMENTS

| | | |
|---|---|---|
| JP | 10250836 A | 9/1998 |
| JP | 10320049 A | 12/1998 |

*Primary Examiner* — Seahvosh Nikmanesh
(74) *Attorney, Agent, or Firm* — Greer Burns & Crain Ltd

(57) ABSTRACT

An automated workpiece conveying vehicle included in a conveyance system that conveys a workpiece to each of a plurality of processing apparatuses is provided. The automated workpiece conveying vehicle includes: a workpiece support part that supports the workpiece; a traveling mechanism provided on the workpiece support part; a vibration detection unit that detects vibration of the workpiece support part and records the vibration as vibration data; and a receiver that receives a control signal transmitted from a control unit included in the conveyance system, the control signal instructing conveyance of the workpiece to the processing apparatus.

4 Claims, 22 Drawing Sheets

(56) References Cited

U.S. PATENT DOCUMENTS

| | | | |
|---|---|---|---|
| 2007/0137570 A1* | 6/2007 | Fukuoka | B65G 49/065 118/719 |
| 2010/0024233 A1* | 2/2010 | Boland | B24B 49/02 33/628 |
| 2012/0331592 A1* | 12/2012 | Ohnesorge | G01Q 40/00 850/1 |
| 2017/0305012 A1* | 10/2017 | Nagata | B25J 13/088 |
| 2019/0160757 A1* | 5/2019 | Hiroyasu | B29C 66/431 |
| 2019/0277880 A1* | 9/2019 | Kinoshita | G01C 21/165 |
| 2020/0399069 A1* | 12/2020 | Kirchner | B65G 43/08 |
| 2021/0016973 A1* | 1/2021 | Helfenstein | B65G 27/08 |

* cited by examiner

US 10,974,359 B2

AUTOMATED WORKPIECE CONVEYING VEHICLE

BACKGROUND OF THE INVENTION

Field of the Invention

The present invention relates to an automated workpiece conveying vehicle that automatically conveys a workpiece to a processing apparatus.

Description of the Related Art

In a manufacturing process of device chips incorporated into electronic equipment and so forth, a plate-shaped workpiece typified by a semiconductor wafer or resin package substrate is processed by various kinds of processing apparatuses. When the workpiece is conveyed to this processing apparatus, for example, a conveyance system including an automated workpiece conveying vehicle that automatically convey the workpiece is often used (see, for example, Japanese Patent Laid-open No. Hei 10-250836 and Japanese Patent Laid-open No. Hei 10-320049).

SUMMARY OF THE INVENTION

Incidentally, in the conveyance system including the automated workpiece conveying vehicle as aforementioned, on one hand the need for an operator for confirming the status of conveyance of the workpiece is eliminated, but, on the other hand, an accident such as collision of the automated workpiece conveying vehicle cannot be found properly. Therefore, there have been cases where although a workpiece being conveyed is broken by an accident such as collision of the automated workpiece conveying vehicle, the breakage of the workpiece is not noticed and the workpiece is conveyed as it is and processed. In addition, it has been impossible to prove that such an accident has not been generated.

Accordingly, it is an object of the present invention to provide an automated workpiece conveying vehicle capable of detecting properly an accident such as collision.

In accordance with an aspect of the present invention, there is provided an automated workpiece conveying vehicle included in a conveyance system that conveys a workpiece to each of a plurality of processing apparatuses, the automated workpiece conveying vehicle including: a workpiece support part that supports the workpiece; a traveling mechanism that is provided on the workpiece support part; a vibration detection unit that detects vibration of the workpiece support part and records the vibration as vibration data; and a receiver that receives a control signal transmitted from a control unit included in the conveyance system, the control signal instructing conveyance of the workpiece to the processing apparatus.

In the aspect of the present invention described above, preferably, the conveyance system includes a conveyance passage set in a space directly above the processing apparatus across a plurality of the processing apparatuses, and the automated workpiece conveying vehicle detects vibration when traveling on the conveyance passage and records the vibration as the vibration data by the vibration detection unit.

Furthermore, in the aspect of the present invention described above, preferably, the automated workpiece conveying vehicle includes a camera unit that images an ambient environment or the conveyance passage and records an image picked up.

Moreover, in the aspect of the present invention described above, preferably, the automated workpiece conveying vehicle includes a transmitter that transmits the vibration data or the picked-up image to the control unit.

The automated workpiece conveying vehicle according to the aspect of the present invention includes the vibration detection unit that detects vibration of the workpiece support part and records the vibration as vibration data, in addition to the workpiece support part that supports the workpiece, the traveling mechanism that is provided on the workpiece support part, and a receiver that receives a control signal transmitted from the control unit included in the conveyance system, the control signal instructing conveyance of the workpiece to the processing apparatus. Therefore, an accident such as collision can be detected properly on the basis of the vibration detected by the vibration detection unit. The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described below referring to the attached drawings. Note that while in each of the following embodiments the automated workpiece conveying vehicle will be described by taking as an example a conveyance system in which a workpiece or the like is conveyed to a plurality of cutting apparatuses, the conveyance system including the automated workpiece conveying vehicle of the present invention needs only to be configured in such a manner as to be able to convey a workpiece or the like to arbitrary plural processing apparatuses. In other words, the destination of the workpiece or the like conveyed by the automated workpiece conveying vehicle may be a processing apparatus other than a cutting apparatus.

For instance, the conveyance system including the automated workpiece conveying vehicle of the present invention may be configured such as to be able to convey a workpiece to a plurality of laser processing apparatuses. In addition, the conveyance system including the automated workpiece conveying vehicle of the present invention may be configured to be able to convey a workpiece sequentially to a plurality of kinds of processing apparatuses which are used for a series of processing, for example.

Embodiment 1

Figure 1:
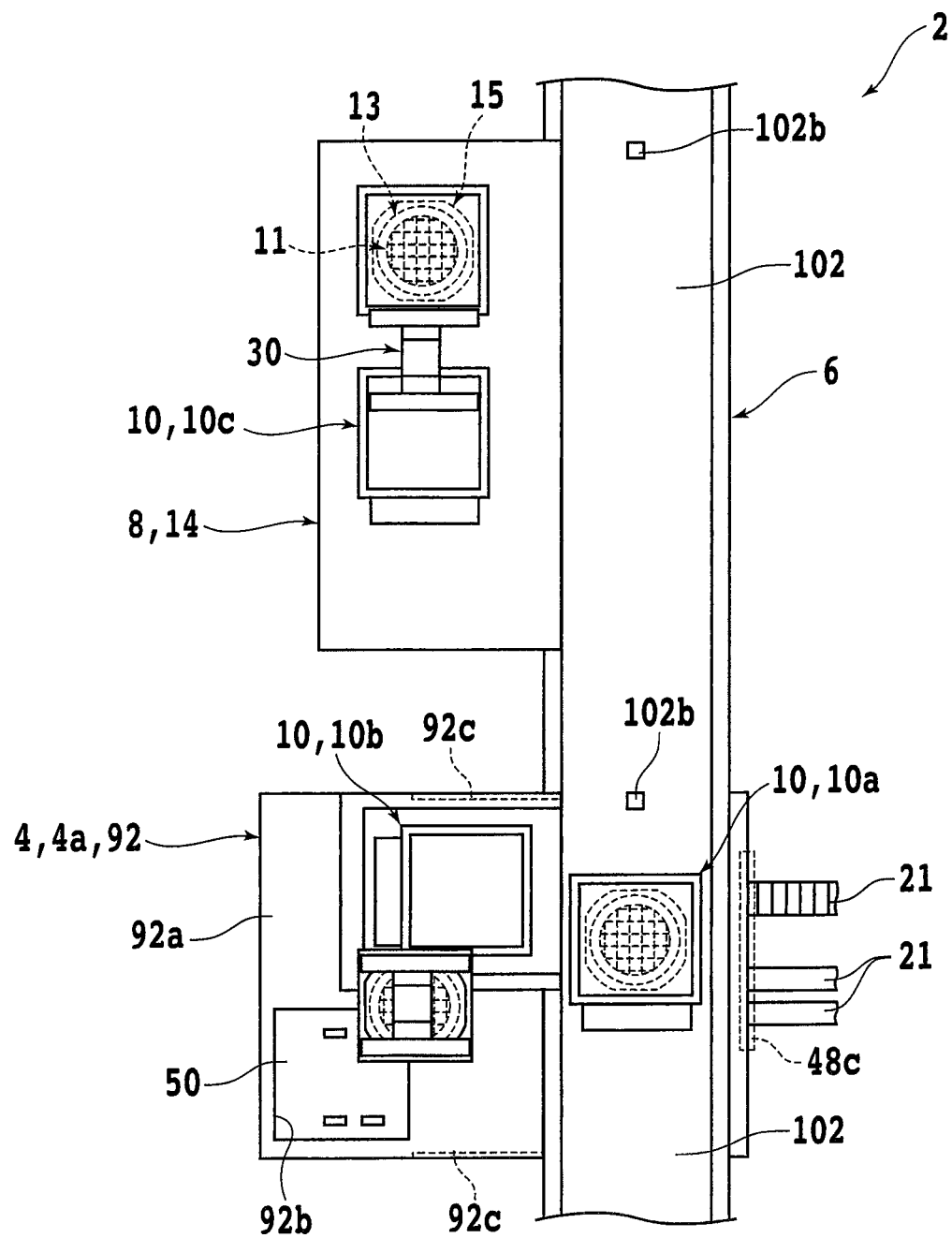
FIG. 1 is a plan view illustrating a configuration example of a conveyance system according to Embodiment 1.
Figure 2:
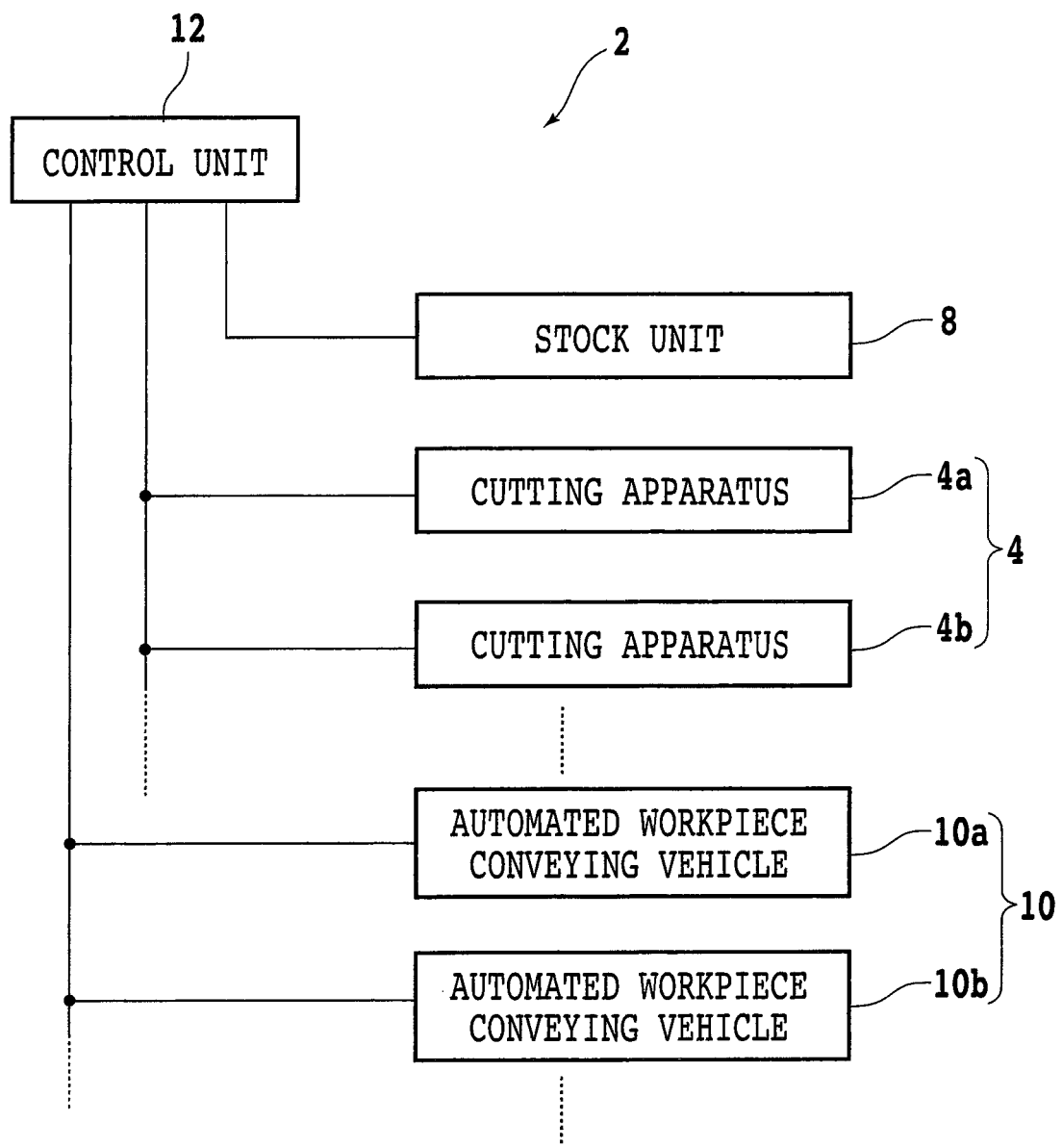
FIG. 2 is a functional block diagram illustrating an example of the connection relationship of the conveyance system according to Embodiment 1.

FIG. 1 is a plan view illustrating a configuration example of a conveyance system 2 according to the present embodiment and FIG. 2 is a functional block diagram illustrating an example of the connection relationship of the conveyance system 2. As illustrated in FIG. 1, the conveyance system 2 according to the present embodiment includes a conveyance passage 6 for conveying a plate-shaped workpiece 11 processed by a cutting apparatus (processing apparatus) 4.

The workpiece 11 is a wafer that is composed of a semiconductor material such as silicon and has a circular disc shape, for example. The front surface side of this workpiece 11 is segmented into plural small regions by plural planned dividing lines (streets) intersecting each other and a device such as an integrated circuit (IC) or a micro electro mechanical system (MEMS) is formed in each small region.

A tape (dicing tape) 13 with a diameter larger than the workpiece 11 is stuck to the back surface side of the workpiece 11. The peripheral part of the tape 13 is fixed to a ring-shaped frame 15 that surrounds the workpiece 11. The workpiece 11 is conveyed to the cutting apparatus 4 in the state of being supported by the frame 15 with the intermediary of this tape 13.

Although the wafer that is composed of a semiconductor material such as silicon and has a circular disc shape is employed as the workpiece 11 in the present embodiment, there is no limit to the material, shape, structure, size, and so forth of the workpiece 11. For example, it is also possible to use a substrate or the like composed of a material such as another semiconductor, ceramic, resin, or metal as the workpiece 11. Similarly, there is no limit also to the kind, quantity, shape, structure, size, arrangement, and so forth of the devices. The devices do not have to be formed on the workpiece 11.

The cutting apparatus 4 that processes this workpiece 11 is connected to the conveyance system 2 as the conveyance destination of the workpiece 11. However, the cutting apparatus 4 is not necessarily a constituent element of the conveyance system 2. Thus, the cutting apparatus 4 may be changed or omitted according to the form of use of the conveyance system 2 as described above.

Furthermore, for convenience of description, only one cutting apparatus 4a is illustrated in FIG. 1 and two cutting apparatuses 4a and 4b are illustrated in FIG. 2. However, in the present embodiment, two or more cutting apparatuses 4 are necessary as the conveyance destination of the workpiece 11. That is, the number of processing apparatuses connected to the conveyance system 2 is two or more.

The conveyance passage 6 is disposed across plural cutting apparatuses 4 so that the workpiece 11 can be conveyed to each cutting apparatus 4. That is, the plural cutting apparatuses 4 are coupled to each other through the conveyance passage 6. Furthermore, the conveyance passage 6 is disposed in a space directly above the cutting apparatus 4. For this reason, the conveyance passage 6 does not interfere with conduits 21 and so forth connected to a side surface of each cutting apparatus 4.

Below the conveyance passage 6, a stock unit 8 that can house plural workpieces 11 is disposed besides the cutting apparatus 4. The workpiece 11 housed in the stock unit 8 is carried in to an automated workpiece conveying vehicle 10 at an arbitrary timing. The automated workpiece conveying vehicle 10 travels on the conveyance passage 6 and conveys the workpiece 11 to each cutting apparatus 4. Although three automated workpiece conveying vehicles 10a, 10b, and 10c are illustrated in FIG. 1 and two automated workpiece conveying vehicles 10a and 10b are illustrated in FIG. 2, there is no limit to the number of automated workpiece conveying vehicles 10 included in the conveyance system 2.

As illustrated in FIG. 2, to the cutting apparatuses 4, the stock unit 8, and the automated workpiece conveying vehicles 10, a control unit 12 that controls operation of them is wirelessly connected. However, it suffices for the control unit 12 to be configured to be capable of controlling operation of the cutting apparatuses 4, the stock unit 8, and the automated workpiece conveying vehicles 10 and the control unit 12 is connected to them in a wired manner in some cases.

Figure 3:
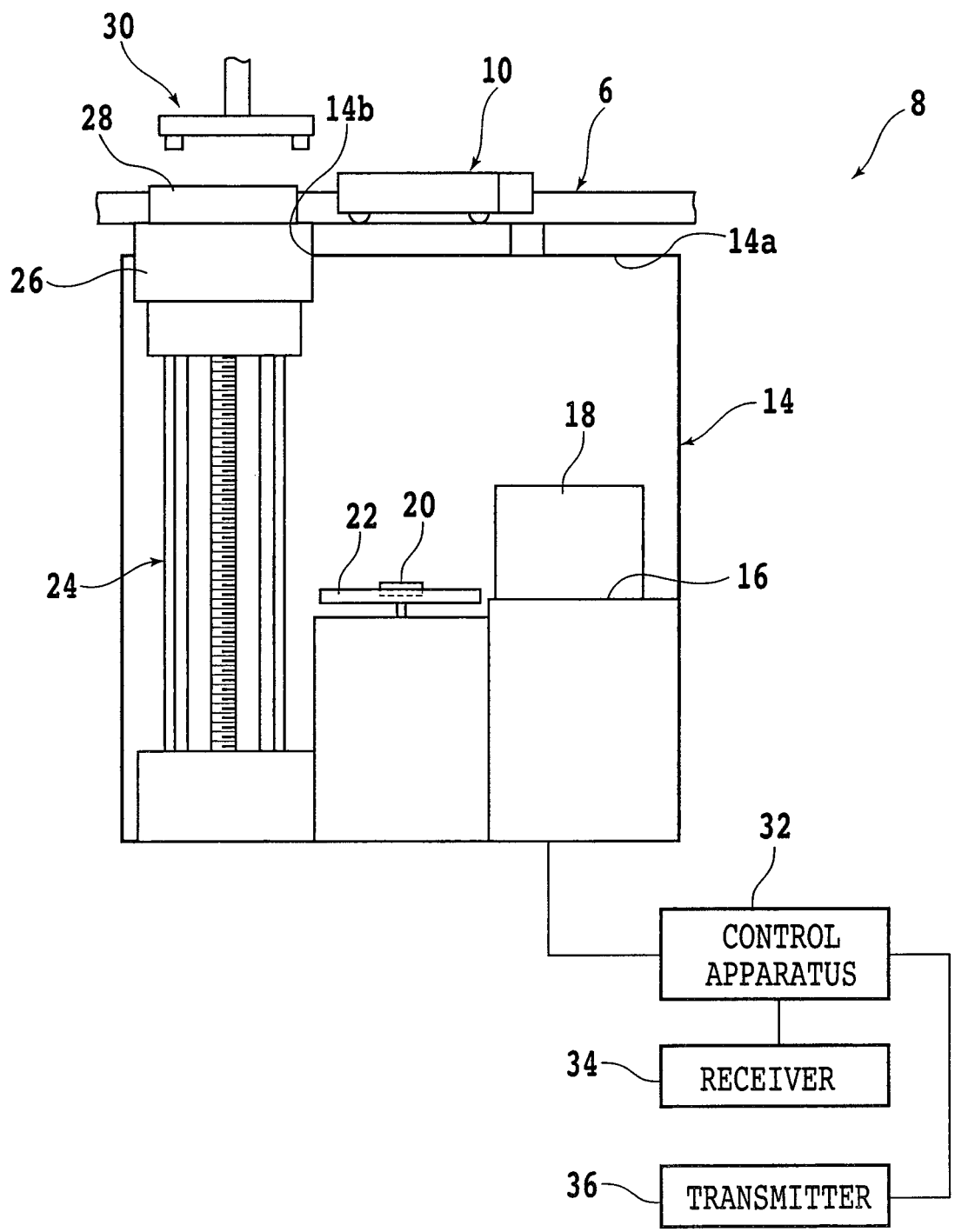
FIG. 3 is a side view schematically illustrating a configuration example of a stock unit according to Embodiment 1.

FIG. 3 is a side view schematically illustrating a configuration example of the stock unit 8. As illustrated in FIG. 3, the stock unit 8 includes a casing 14 that houses various constituent elements. In this FIG. 3, only the contour of the casing 14 is illustrated for convenience of description.

In the casing 14, a first cassette support base 16 that moves up and down by a first raising-lowering mechanism (not illustrated) of a ball screw type is disposed, for example. A cassette (workpiece stocker) 18 that can house plural workpieces 11 is placed on the upper surface of the first cassette support base 16. This cassette 18 houses the workpieces 11 in the state of being supported by the frame 15 with the intermediary of the tape 13 as described above.

A push-pull arm 20 that can move while grasping the frame 15 is disposed on a lateral side of the first cassette support base 16. For example, when the height of the frame 15 housed in the cassette 18 is adjusted to the height of the push-pull arm 20 by the first raising-lowering mechanism and the frame 15 in the cassette 18 is grasped by this push-pull arm 20, the frame 15 can be drawn out to the outside of the cassette 18.

A pair of guide rails 22 made to get closer to and further away from each other while the state in which the guide rails 22 are parallel to each other is kept are disposed at positions that sandwich the push-pull arm 20. Each guide rail 22 includes a support surface that supports the frame 15 from the lower side and a side surface substantially perpendicular to the support surface. The guide rails 22 sandwich the frame 15 drawn out of the cassette 18 by the push-pull arm 20 and adjust the frame 15 to a predetermined position.

On a lateral side of the push-pull arm 20 and the pair of guide rails 22, a second cassette support base 26 that moves up and down by a second raising-lowering mechanism 24 of a ball screw type is disposed, for example. A cassette (cassette for conveyance) 28 that can house one workpiece 11 is placed on the upper surface of this second cassette support base 26. The cassette 28 may be configured to be capable of housing two or more workpieces 11.

The frame 15 adjusted to the predetermined position by the pair of guide rails 22 is grasped by the push-pull arm 20 again and is inserted from a lateral side into the cassette 28 on the second cassette support base 26 whose height is adjusted by the second raising-lowering mechanism 24. When the workpiece 11 is housed in the cassette 28, the second raising-lowering mechanism 24 raises the second cassette support base 26.

In a region directly above the second cassette support base 26, an opening 14b that vertically penetrates a ceiling 14a of the casing 14 is made. This opening 14b is formed to have shape and size that at least allow the cassette 28 placed on the second cassette support base 26 to pass through the opening 14b. Thus, by raising the second cassette support base 26 by the second raising-lowering mechanism 24, the cassette 28 that houses the workpiece 11 can be exposed to the outside of the casing 14 through the opening 14b.

A cassette conveying arm (workpiece conveying part) 30 that conveys the cassette 28 exposed at the opening 14b to the automated workpiece conveying vehicle 10 that has stopped near this opening 14b is disposed outside the casing 14. A control apparatus 32 for controlling operation of the stock unit 8 is connected to constituent elements such as the first raising-lowering mechanism, the push-pull arm 20, the pair of guide rails 22, the second raising-lowering mechanism 24, and the cassette conveying arm 30.

A receiver 34 that receives a signal for control (control signal) transmitted from the control unit 12 of the conveyance system 2 and a transmitter 36 that transmits a signal for notification (notification signal) to the control unit 12 are further connected to the control apparatus 32. The control apparatus 32 controls the operation of the stock unit 8 based on the signal received by the receiver 34. Furthermore, the control apparatus 32 transmits the necessary signal to the control unit 12 through the transmitter 36.

Figure 4A:
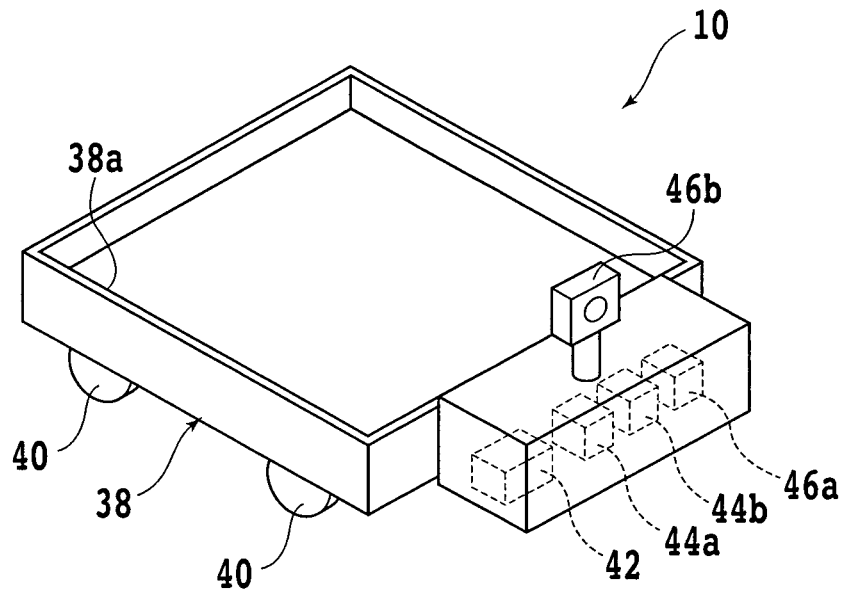
FIG. 4A is a perspective view illustrating a configuration example of an automated workpiece conveying vehicle.
Figure 4B:
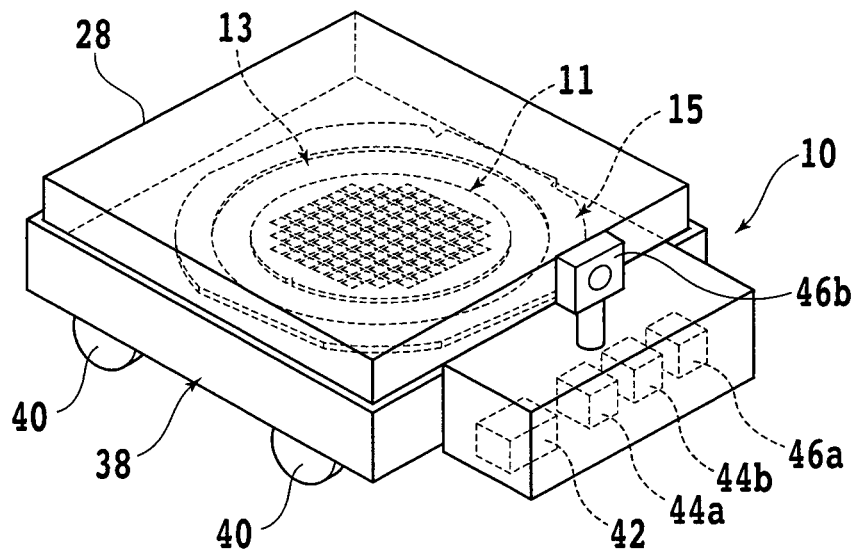
FIG. 4B is a perspective view illustrating the automated workpiece conveying vehicle in the state in which a cassette is placed thereon.

FIG. 4A is a perspective view illustrating a configuration example of the automated workpiece conveying vehicle 10 and FIG. 4B is a perspective view illustrating the automated workpiece conveying vehicle 10 in the state in which the cassette 28 is placed thereon. As illustrated in FIG. 4A, the automated workpiece conveying vehicle 10 includes a tray-shaped chassis (workpiece support part) 38. A recess 38a corresponding to the shape and size of the cassette 28 is made on the upper surface side of the chassis 38 and the cassette 28 conveyed by the cassette conveying arm 30 is placed in this recess 38a of the chassis 38.

Plural (in the present embodiment, four) wheels (traveling mechanism) 40 are attached to the lower surface side of the chassis 38. Each wheel 40 is coupled to a rotational drive source such as a motor and rotates. By rotating these wheels 40 by the rotational drive source, the automated workpiece conveying vehicle 10 travels on the conveyance passage 6. As the wheels 40, so-called Mecanum wheels in which plural inclined barrel-shaped (cylinder-shaped) rotating bodies are attached to the outer circumferential surface in contact with the conveyance passage 6, or the like, can be used.

A control apparatus 42 that controls operation of the automated workpiece conveying vehicle 10 is disposed on a side surface of the chassis 38. To this control apparatus 42, a receiver 44a that receives a signal for control (control signal) transmitted from the control unit 12 of the conveyance system 2 and a transmitter 44b that transmits a signal for notification (notification signal) to the control unit 12 are connected. The control apparatus 42 controls the operation (traveling) of the automated workpiece conveying vehicle 10 based on the signal received by the receiver 44a. Furthermore, the control apparatus 42 transmits the necessary signal to the control unit 12 through the transmitter 44b.

Further, a vibration detection unit 46a for detecting vibration of the chassis 38 or the like and recording the vibration as vibration data is connected to the control apparatus 42. There is no limit to the specific configuration of the vibration detection unit 46a; for example, a vibration detection unit 46a including a vibration detection element composed of MEMS can be used.

During traveling of the automated workpiece conveying vehicle 10, for example, vibration of the chassis 38 or the like is constantly detected and is recorded as vibration data by the vibration detection unit 46a. The control apparatus 42 transmits the vibration data, recorded in the vibration detection unit 46a, from the transmitter 44b to the control unit 12, as required.

In addition, a camera unit 46b for imaging the ambient environment of the automated workpiece conveying vehicle 10 or the conveyance passage 6 and recording a picked-up image is connected to the control apparatus 42. There is no limit to the specific configuration of the camera unit 46b. For example, a camera unit 46b including an image sensor composed of a charge coupled device (CCD) or a complementary metal oxide semiconductor (CMOS) can be used.

During traveling of the automated workpiece conveying vehicle 10, for example, the ambient environment of the automated workpiece conveying vehicle 10 or the conveyance passage 6 is constantly imaged, and an image picked up is recorded. The control apparatus 42 transmits the picked-up image, recorded in the camera unit 46b, from the transmitter 44b to the control unit 12, as required.

Note that the timing of transmitting the vibration data or the picked-up image to the control unit 12 is arbitrarily set. For instance, the control apparatus 42 may transmit the vibration data or the picked-up image from the transmitter 44b to the control unit 12 when a shock whose magnitude is not less than a threshold is detected by the vibration detection unit 46a. In addition, the vibration data or the picked-up image may be transmitted periodically at a predetermined timing or may be transmitted on a real-time basis.

Figure 5:
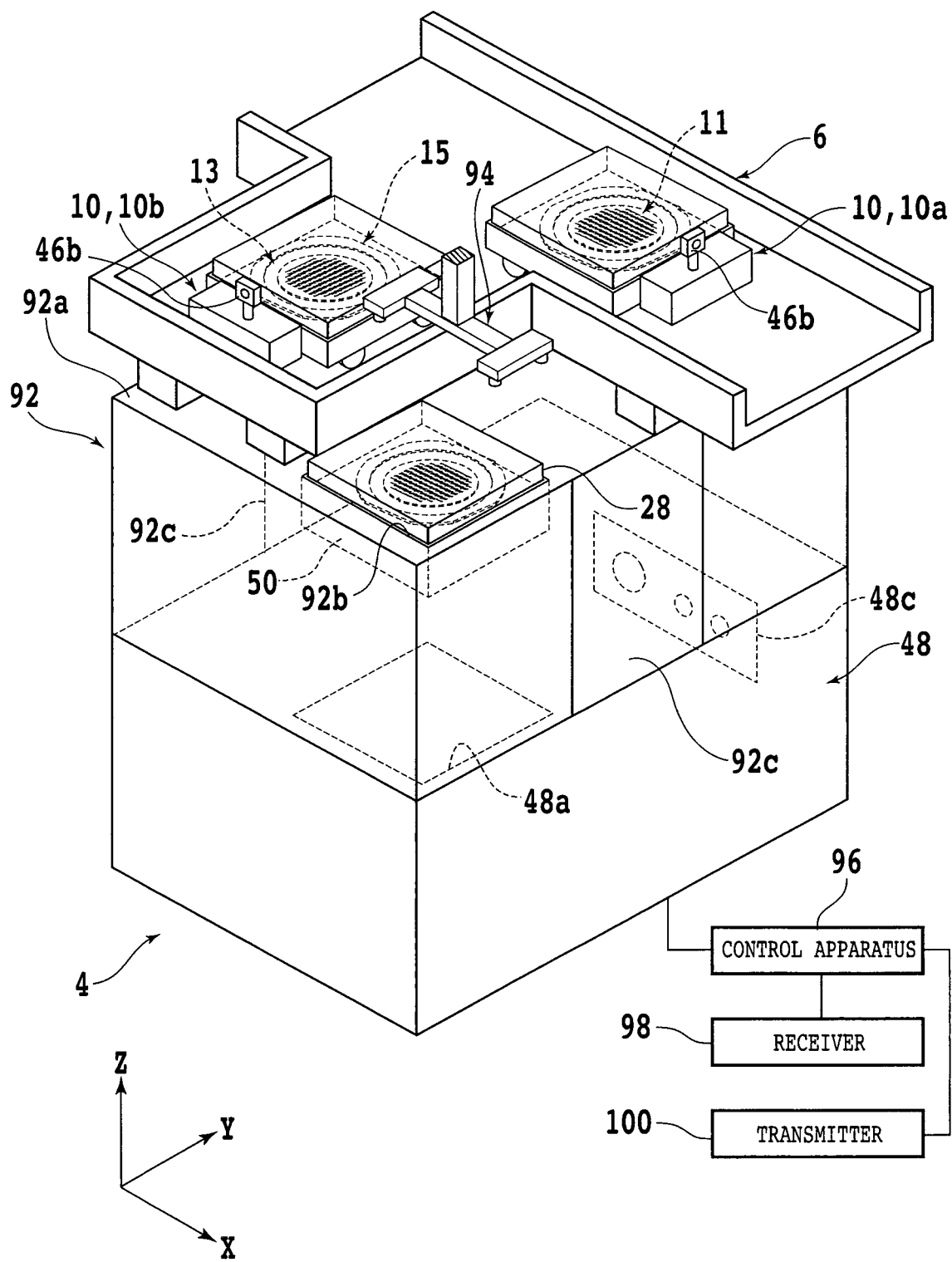
FIG. 5 is a perspective view illustrating the appearance of a cutting apparatus, a conveyance passage, and so forth according to Embodiment 1.
Figure 6:
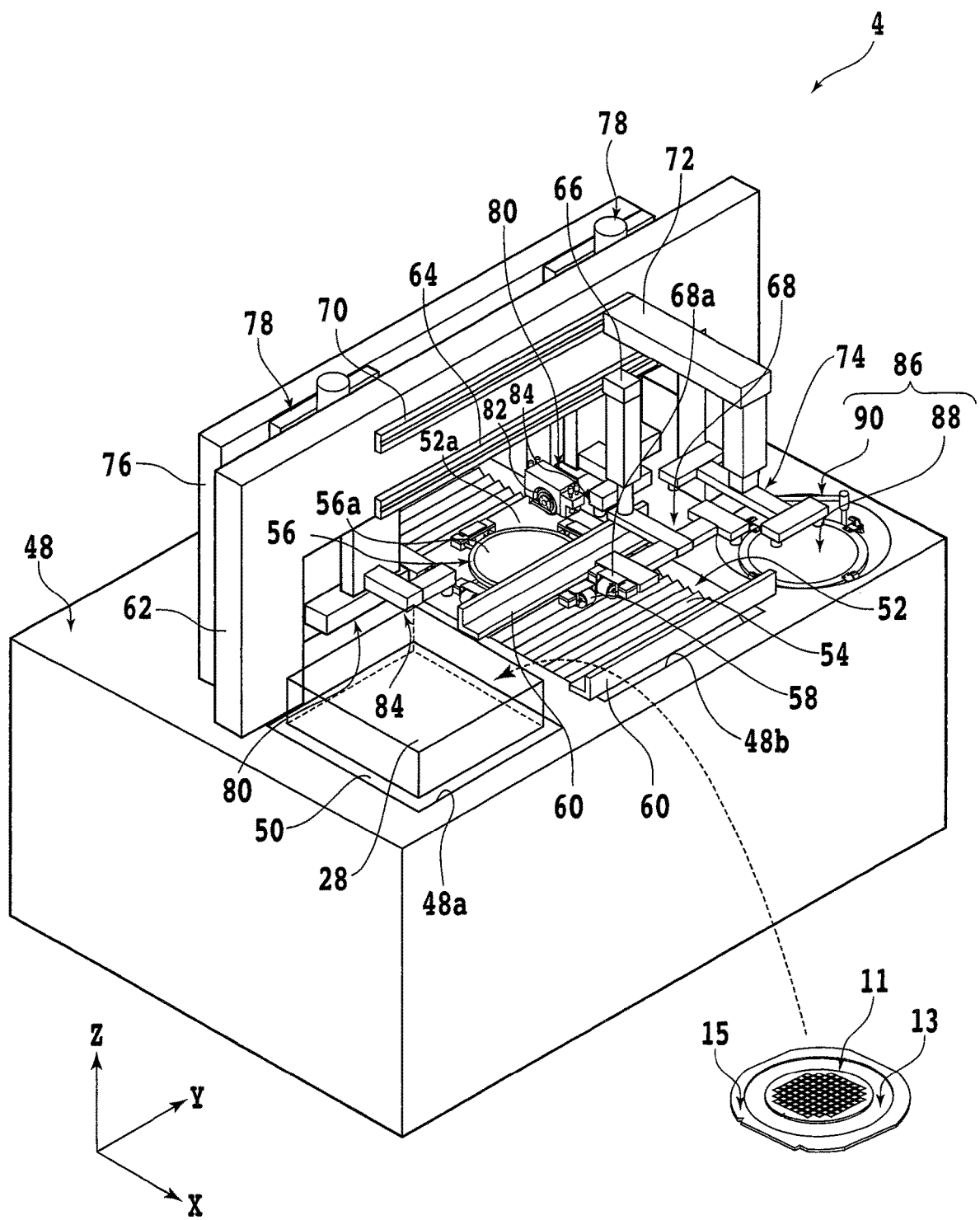
FIG. 6 is a perspective view illustrating a configuration example of the cutting apparatus.

FIG. 5 is a perspective view illustrating the appearance of the cutting apparatus 4, the conveyance passage 6, and so forth and FIG. 6 is a perspective view illustrating a configuration example of the cutting apparatus 4. As illustrated in FIG. 5 and FIG. 6, the cutting apparatus 4 includes a pedestal 48 that supports the respective constituent elements. An opening 48a is formed at a corner part of the pedestal 48 and a cassette support base 50 that moves up and down by a raising-lowering mechanism (not illustrated) is disposed in a region corresponding to this opening 48a. The above-described cassette 28 is placed on the upper surface of the cassette support base 50. In FIG. 5 and FIG. 6, only the contour of the cassette 28 is illustrated for convenience of description.

As illustrated in FIG. 6, an opening 48b that is long in an X-axis direction (front-rear direction, processing feed direction) is formed on a lateral side of the opening 48a. An X-axis movement mechanism (processing feed unit) 52 of a ball screw type and a dust-proof and drip-proof cover 54 that covers the upper part of the X-axis movement mechanism 52 are disposed in the opening 48b. The X-axis movement mechanism 52 includes an X-axis movement table 52a and moves this X-axis movement table 52a in the X-axis direction.

A chuck table (holding table) 56 that sucks and holds the workpiece 11 is disposed on the X-axis movement table 52a. The chuck table 56 is coupled to a rotational drive source (not illustrated) such as a motor and rotates around a rotation axis substantially parallel to a Z-axis direction (vertical direction, cutting-in feed direction). Furthermore, the chuck table 56 moves in the X-axis direction (processing feed) by the above-described X-axis movement mechanism 52.

The upper surface of the chuck table 56 functions as a holding surface 56a for holding the workpiece 11. The holding surface 56a is connected to a suction source (not illustrated) through a suction path (not illustrated) formed inside the chuck table 56 and so forth. Furthermore, four clamps 58 for fixing the frame 15 that supports the workpiece 11 from four sides are disposed around the chuck table 56.

Above the opening 48b, a pair of guide rails 60 made to get closer to and further away from each other while the state in which the guide rails 60 are parallel to a Y-axis direction (right-left direction, indexing feed direction) is kept are disposed. The pair of guide rails 60 each include a support surface that supports the frame 15 from the lower side and a side surface substantially perpendicular to the support surface. The guide rails 60 sandwich the frame 15 drawn out of the cassette 28 in the X-axis direction and adjust the frame 15 to a predetermined position.

A first support structure 62 with a gate shape is disposed to straddle the opening 48b over the pedestal 48. A first rail 64 along the Y-axis direction is fixed to the front surface of the first support structure 62 (surface on the side of the guide rails 60) and a first conveying unit 68 is coupled to this first rail 64 with the intermediary of a first movement mechanism 66 and so forth.

For example, the first conveying unit 68 gets contact with the upper surface of the frame 15 to suck and hold this frame 15 and moves up and down by the first movement mechanism 66. In addition, the first conveying unit 68 moves in the Y-axis direction along the first rail 64. A grasping mechanism 68a for grasping the frame 15 is disposed on the first conveying unit 68 on the side of the opening 48a.

For example, when the frame 15 is grasped by the grasping mechanism 68a and the first conveying unit 68 is moved in the Y-axis direction, the frame 15 in the cassette 28 can be drawn out to the pair of guide rails 60 or the frame 15 on the pair of guide rails 60 can be inserted into the cassette 28. After the position of the frame 15 is adjusted by the pair of guide rails 60, this frame 15 (workpiece 11) is carried in to the chuck table 56 by the first conveying unit 68.

Furthermore, on the front surface of the first support structure 62, a second rail 70 along the Y-axis direction is fixed to the upper side of the first rail 64. A second conveying unit 74 is coupled to this second rail 70 with the intermediary of a second movement mechanism 72 and so forth. For example, the second conveying unit 74 gets contact with the upper surface of the frame 15 to suck and hold this frame 15 and moves up and down by the second movement mechanism 72. In addition, the second conveying unit 74 moves in the Y-axis direction along the second rail 70.

A second support structure 76 with a gate shape is disposed on the rear side of the first support structure 62. Two sets of cutting units 80 are each disposed on the front surface of the second support structure 76 (surface on the side of the first support structure 62) with the intermediary of a Y-axis/Z-axis movement mechanism (indexing feed unit, cutting-in feed unit) 78. The cutting unit 80 moves in the Y-axis direction (indexing feed) and moves in the Z-axis direction (cutting-in feed) by the Y-axis/Z-axis movement mechanism 78.

Each cutting unit 80 includes a spindle (not illustrated) that serves as a rotating shaft substantially parallel to the Y-axis direction. A cutting blade 82 with a circular ring shape is mounted to one end side of the spindle. A rotational drive source (not illustrated) such as a motor is coupled to the other end side of each spindle. Furthermore, a nozzle for supplying a cutting liquid such as purified water to the workpiece 11 and the cutting blade 82 is disposed near the cutting blade 82.

While the cutting liquid is supplied from this nozzle, the rotated cutting blade 82 is caused to cut into the workpiece 11 held by the chuck table 56. Thereby, the workpiece 11 can be cut. A camera unit (imaging unit) 84 for imaging the workpiece 11 held by the chuck table 56 and so forth is disposed at a position adjacent to the cutting unit 80. This camera unit 84 also moves in the Y-axis direction and moves in the Z-axis direction by the Y-axis/Z-axis movement mechanism 78.

A cleaning unit 86 is disposed at a position on the opposite side to the opening 48a across the opening 48b. The cleaning unit 86 includes a spinner table 88 that sucks and holds the workpiece 11 in a cleaning space with a cylindrical shape. A rotational drive source (not illustrated) that rotates the spinner table 88 at a predetermined speed is coupled to the lower part of the spinner table 88.

A spray nozzle 90 that sprays a fluid for cleaning (typically, mixed fluid obtained by mixing water and air) toward the workpiece 11 held by the spinner table 88 is disposed above the spinner table 88. The workpiece 11 can be cleaned by rotating the spinner table 88 that holds the workpiece 11 and spraying the fluid for cleaning from the spray nozzle 90.

After the workpiece 11 is cut by the cutting unit 80, the frame 15 is conveyed to the cleaning unit 86 by the second conveying unit 74, for example. After the workpiece 11 is cleaned by the cleaning unit 86, for example, the frame 15 is placed on the pair of guide rails 60 by the first conveying unit 68 and thereafter this frame 15 is grasped by the grasping mechanism 68a and is housed in the cassette 28.

As illustrated in FIG. 5, the upper surface side of the pedestal 48 is covered by a cover 92 and the above-described respective constituent elements are housed inside the cover 92. An opening 92b that vertically penetrates a ceiling 92a of the cover 92 is made in a region directly above the opening 48a. Thus, when the cassette support base 50 is raised by the raising-lowering mechanism, the upper surface of the cassette support base 50 can be exposed to the outside of the cover 92 through this opening 92b. The shape and size of the opening 92b are the same as the shape and size of the opening 48a made in the pedestal 48, for example.

On the ceiling 92a of the cover 92, a cassette conveying arm 94 that conveys the cassette 28 between the cassette support base 50 located at a height equivalent to that of the opening 92b and the automated workpiece conveying vehicle 10 that has stopped near the opening 92b is disposed, for example. This cassette conveying arm 94 is connected to a control apparatus 96 together with the raising-lowering mechanism that raises and lowers the cassette support base 50 and so forth (FIG. 5).

A receiver 98 that receives a signal for control (control signal) transmitted from the control unit 12 of the conveyance system 2 and a transmitter 100 that transmits a signal for notification (notification signal) to the control unit 12 are further connected to the control apparatus 96. The control apparatus 96 controls the respective constituent elements of the above-described cutting apparatus 4 based on the signal received by the receiver 98 and so forth, for example.

A conduit connecting part 48c (FIG. 5) to which various conduits 21 are connected is disposed in a sidewall of the pedestal 48. Furthermore, a door 92c (FIG. 5) opened and closed in maintenance or the like is disposed in a sidewall of the cover 92. Moreover, an operation panel (not illustrated), a display (not illustrated), and so forth may be disposed on a sidewall of the cover 92.

Figure 7:
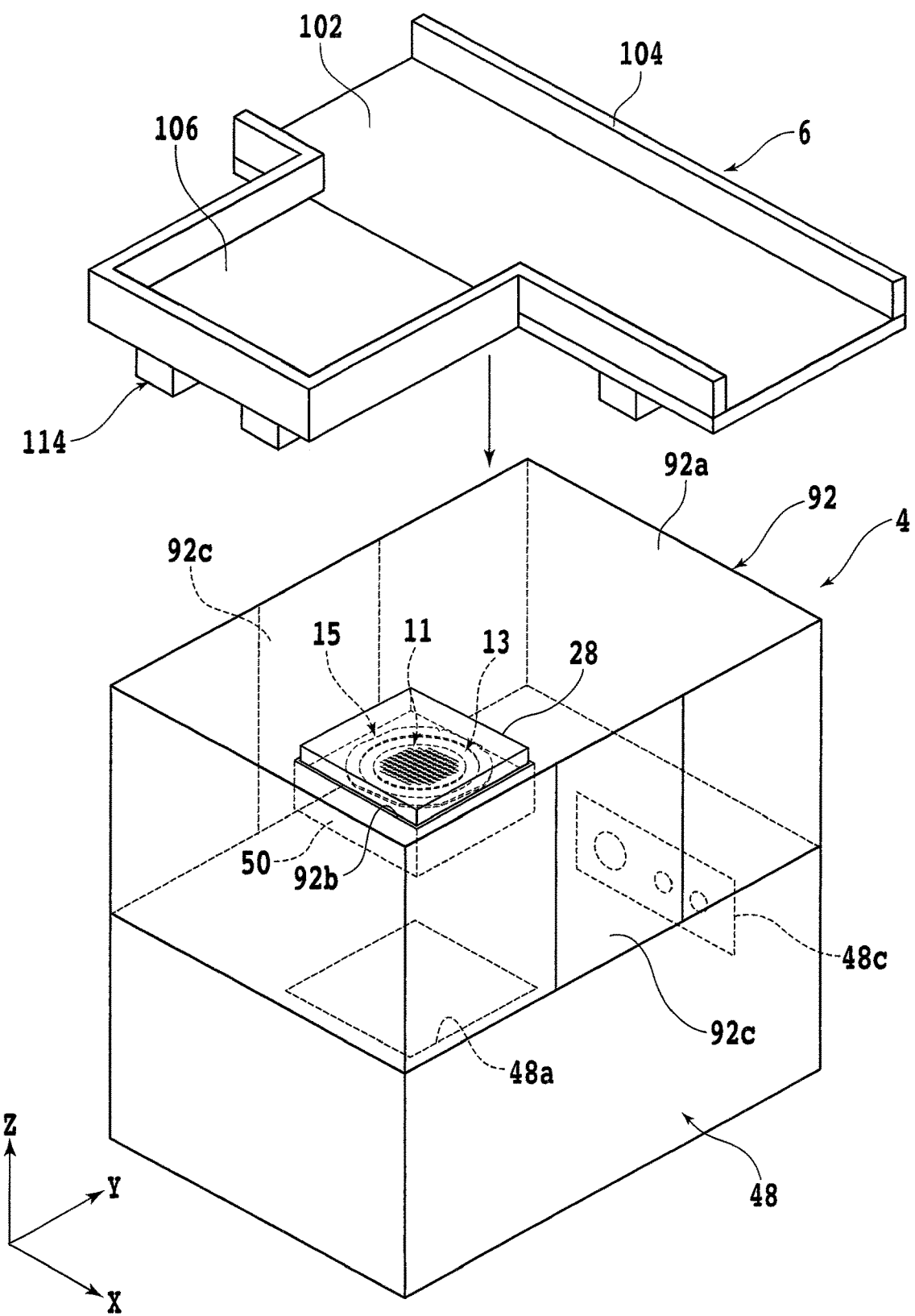
FIG. 7 is a perspective view illustrating how the conveyance passage is set on the cutting apparatus.

FIG. 7 is a perspective view illustrating how the conveyance passage 6 of the conveyance system 2 is set on the cutting apparatus 4. As illustrated in FIG. 7 and so forth, the conveyance passage 6 of the conveyance system 2 according to the present embodiment is mounted to the upper surface side of the ceiling 92a of the cover 92 which the cutting apparatus 4 has. That is, the conveyance passage 6 is set in a space directly above the cutting apparatus 4.

This eliminates interference of the conveyance passage 6 with the structures such as the conduit connecting part 48c and the door 92c disposed in side surfaces of the cutting apparatus 4. That is, the structures of the side surfaces of the cutting apparatus 4 do not need to be considered when the conveyance passage 6 is designed. For this reason, construction of the conveyance system 2 becomes easy.

Figure 8A:
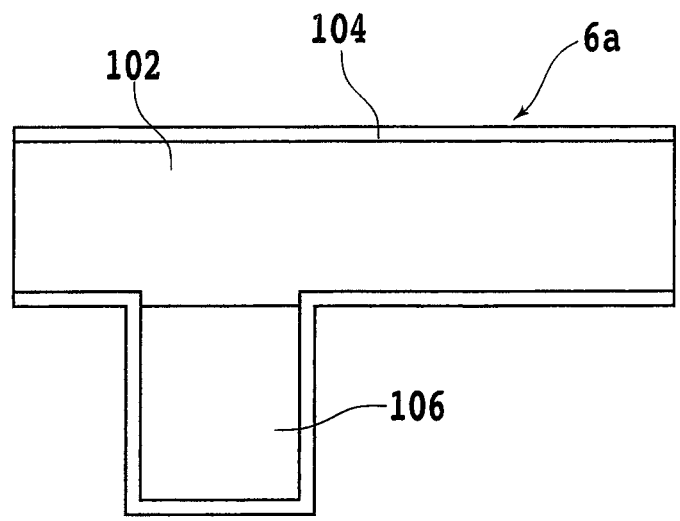
FIG. 8A, FIG. 8B, and FIG. 8C are plan views illustrating configuration examples of a passage module.
Figure 8B:
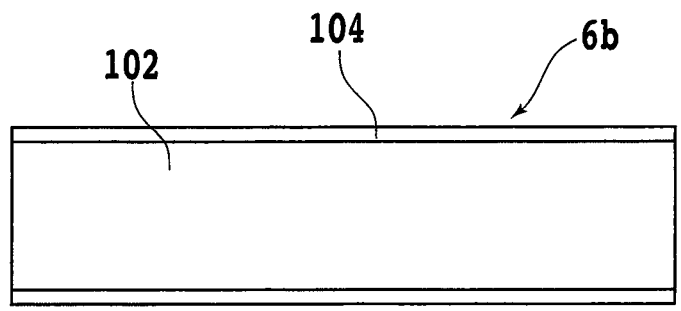
Figure 8C:
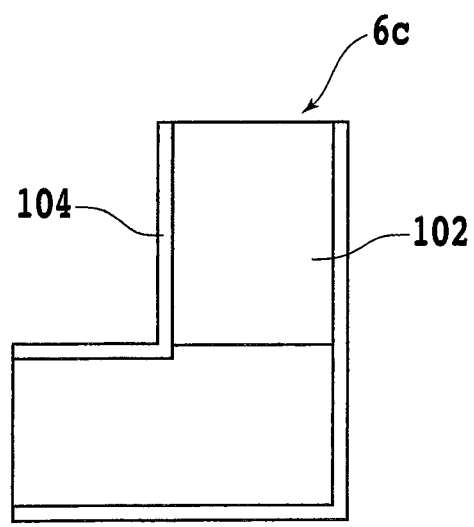

FIG. 8A is a plan view illustrating a configuration example of a passage module 6a used for the conveyance passage 6. FIG. 8B is a plan view illustrating a configuration example of a passage module 6b. FIG. 8C is a plan view illustrating a configuration example of a passage module 6c. The conveyance passage 6 is configured by combining the plural passage modules 6a, 6b, and 6c illustrated in FIG. 8A, FIG. 8B, and FIG. 8C, for example.

The respective passage modules 6a, 6b, and 6c each include a passage part 102 having an upper surface that is suitable for traveling of the automated workpiece conveying vehicle 10 and has high flatness and a guide part 104 that is disposed at ends of the passage part 102 in the width direction and is along this passage part 102. The height of the upper end of the guide part 104 from the passage part 102 is higher than the height of the wheels 40 of the automated workpiece conveying vehicle 10, for example. This can prevent the automated workpiece conveying vehicle 10 that travels on the passage part 102 from falling off from the passage part 102.

The passage module 6a of FIG. 8A further has a waiting part 106 for allowing the automated workpiece conveying vehicle 10 to wait, and is set directly above the cutting apparatus 4 or the like that exchanges the workpiece 11 (cassette 28) with the automated workpiece conveying vehicle 10, for example. Meanwhile, the passage module 6b of FIG. 8B is formed into a straight line shape and the passage module 6c of FIG. 8C is formed into a right-angle shape suitable for a corner.

The passage modules 6b and 6c are used to join adjacent two passage modules 6a, for example. However, there is no limit to the kind, quantity, arrangement (relationship of the connection), and so forth of the passage module configuring the conveyance passage 6. For example, two passage modules 6a may be joined by yet another passage module 6a. Furthermore, for example, it is also possible to use a passage module with a circular arc shape (curved shape) instead of the passage module 6c with the right-angle shape.

Figure 9:
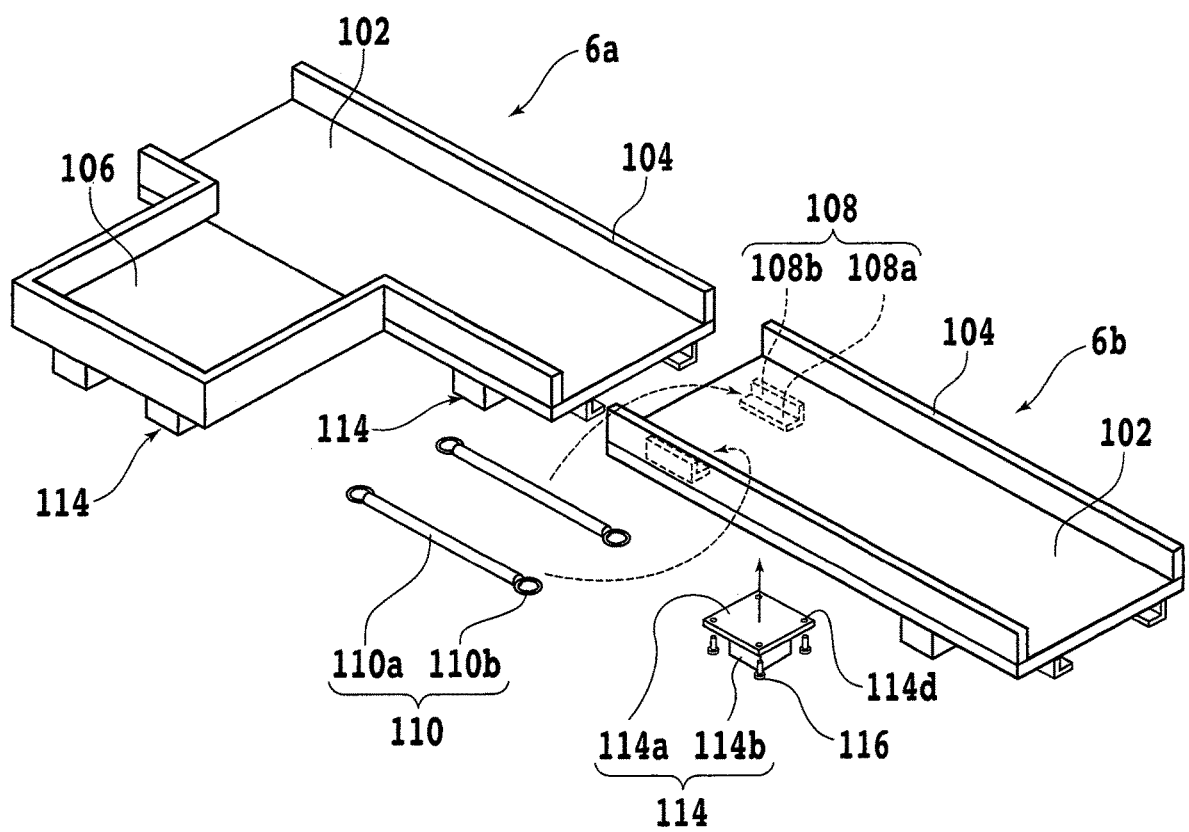
FIG. 9 is a perspective view illustrating how the conveyance passage is formed from the passage modules.
Figure 10A:
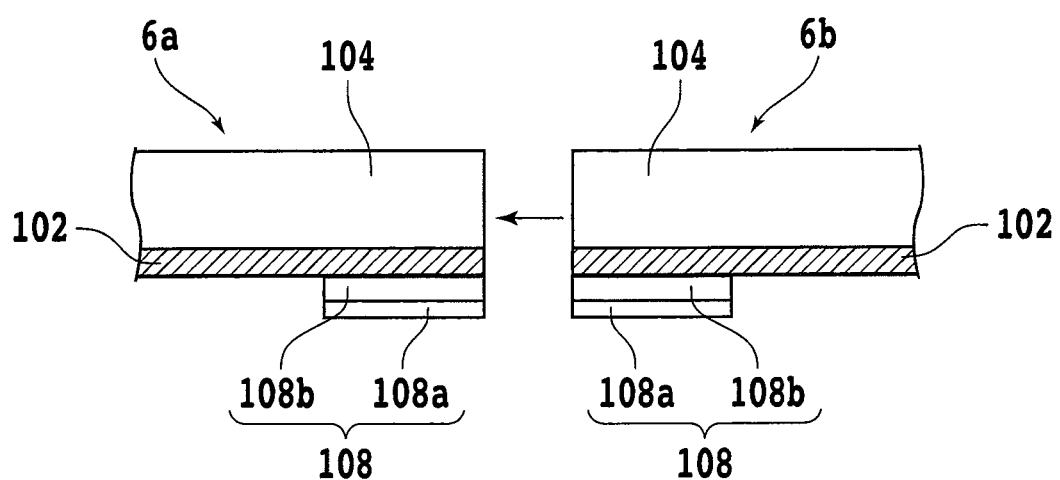
FIG. 10A and FIG. 10B are sectional views illustrating how the passage modules are coupled.
Figure 10B:
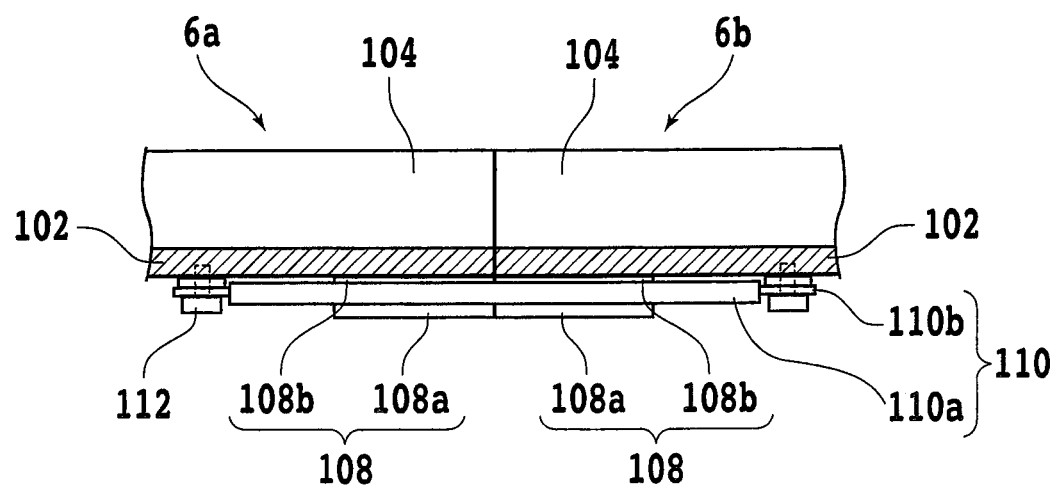
Figure 11:
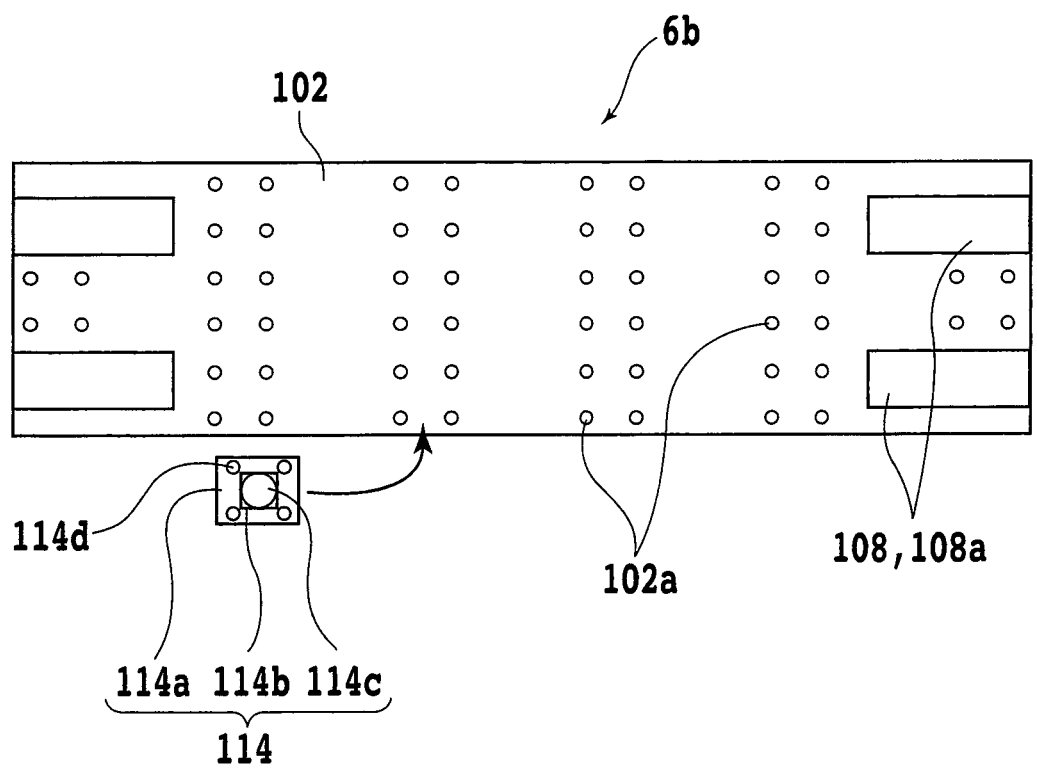
FIG. 11 is a bottom view illustrating a configuration example of the passage module.

FIG. 9 is a perspective view illustrating how the conveyance passage 6 is formed from the passage module 6a and the passage module 6b. FIG. 10A and FIG. 10B are sectional views illustrating how the passage module 6a and the passage module 6b are coupled. Furthermore, FIG. 11 is a bottom view illustrating a configuration example of the passage module 6b.

As illustrated in FIG. 9, a pair of angles (brackets) 108 whose section has an L-shape are disposed at an end part of the lower surface of the passage part 102 in the length direction (end part in the direction along the conveyance passage 6). Each angle 108 includes a substantially-horizontal support surface 108a and a side surface 108b substantially perpendicular to the support surface 108a, and is fixed to the lower surface of the passage part 102 in such a manner that the longitudinal direction of each angle 108 is along the conveyance passage 6.

When the passage module 6a and the passage module 6b are coupled, first, as illustrated in FIG. 10A, an end part of the passage part 102 configuring the passage module 6a in the longitudinal direction and an end part of the passage part 102 configuring the passage module 6b in the longitudinal direction are brought sufficiently close to each other. Then, as illustrated in FIG. 10B, coupling pieces 110 are each inserted into the angle 108 disposed on the passage part 102 configuring the passage module 6a and the angle 108 disposed on the passage part 102 configuring the passage module 6b.

For example, the coupling piece 110 includes a rod part 110a longer than the length obtained by adding the length of the angle 108 of the passage module 6a and the length of the angle 108 of the passage module 6b and ring parts 110b that are disposed at both ends of the rod part 110a and have an opening at the center. The rod parts 110a of these coupling pieces 110 are inserted into the angles 108.

After the rod parts 110a are inserted into the angles 108, bolts 112 are fastened into bolt holes (not illustrated) on the lower surface side of the passage part 102 through the openings of the ring parts 110b. This can couple the passage module 6a and the passage module 6b through the coupling pieces 110. The passage module 6c is also coupled to other passage modules (passage module 6a, passage module 6b, and so forth) by the same procedure.

Mounting of the passage modules 6a, 6b, and 6c to the cutting apparatus 4 is executed with the intermediary of a leg member 114 illustrated in FIG. 9, FIG. 11, and so forth, for example. The leg member 114 includes a plate-shaped base part 114a, a column part 114b that protrudes from the vicinity of the center of a surface of the base part 114a on one side and has a column shape, and a suction adhesion part 114c (FIG. 11) that is mounted to the tip of the column part 114b and has a suction cup shape.

In a region that does not overlap with the column part 114b in the base part 114a, four openings 114d that penetrate this base part 114a in the thickness direction are formed. Furthermore, in the lower surfaces of the passage parts 102 configuring the passage modules 6a, 6b, and 6c, bolt holes 102a (FIG. 11) corresponding to the respective openings 114d are formed.

Thus, when the surface of the base part 114a on the other side is brought into contact with the lower surface of the passage part 102 and bolts 116 are fastened into the bolt holes 102a through the openings 114d, the leg member 114 can be fixed to the passage module 6a, 6b, or 6c. There is no limit to the quantity, arrangement, and so forth of the openings 114d and the bolt holes 102a.

As illustrated in FIG. 11, four bolt holes 102a corresponding to four openings 114d of the base part 114a are formed in each of plural regions of the lower surface of the passage part 102 in the passage module 6b of the present embodiment, and the leg member 114 can be mounted to an arbitrary region. This is similar also to the other passage modules 6a and 6c.

That is, the leg member 114 is mounted to any region selected from the plural regions of the lower surface of the passage part 102. It is desirable to mount plural leg members 114 to each of the passage modules 6a, 6b, and 6c. This makes it easy to stabilize the position of the conveyance passage 6 relative to the cutting apparatus 4.

When the passage module 6a, 6b, or 6c is mounted to the cutting apparatus 4, for example, the position of the passage module 6a, 6b, or 6c is adjusted to the cover 92 of the cutting apparatus 4 and the suction adhesion parts 114c of the leg members 114 are pressed against the upper surface of the ceiling 92a of the cover 92 as illustrated in FIG. 7. This can cause the suction adhesion parts 114c to adhere to the upper surface of the ceiling 92a of the cover 92 by suction and mount the arbitrary passage module 6a, 6b, or 6c to the cover 92. That is, the arbitrary passage module 6a, 6b, or 6c is mounted to the cover 92 of the cutting apparatus 4 with the intermediary of the leg members 114.

All the passage modules 6a, 6b, and 6c do not necessarily have to be mounted to the cutting apparatus 4. For example, the passage module located between two cutting apparatuses 4 is often supported by only the passage module adjacent with the intermediary of the coupling piece 110. Furthermore, as illustrated in FIG. 1, an information providing part 102b such as an identification code typified by a two-dimensional code or a wireless tag is set on the passage part 102 of the passage module mounted to the cutting apparatus 4, the stock unit 8, or the like. This information providing part 102b is used for a check of the position of the automated workpiece conveying vehicle 10 and so forth, for example.

Figure 12:
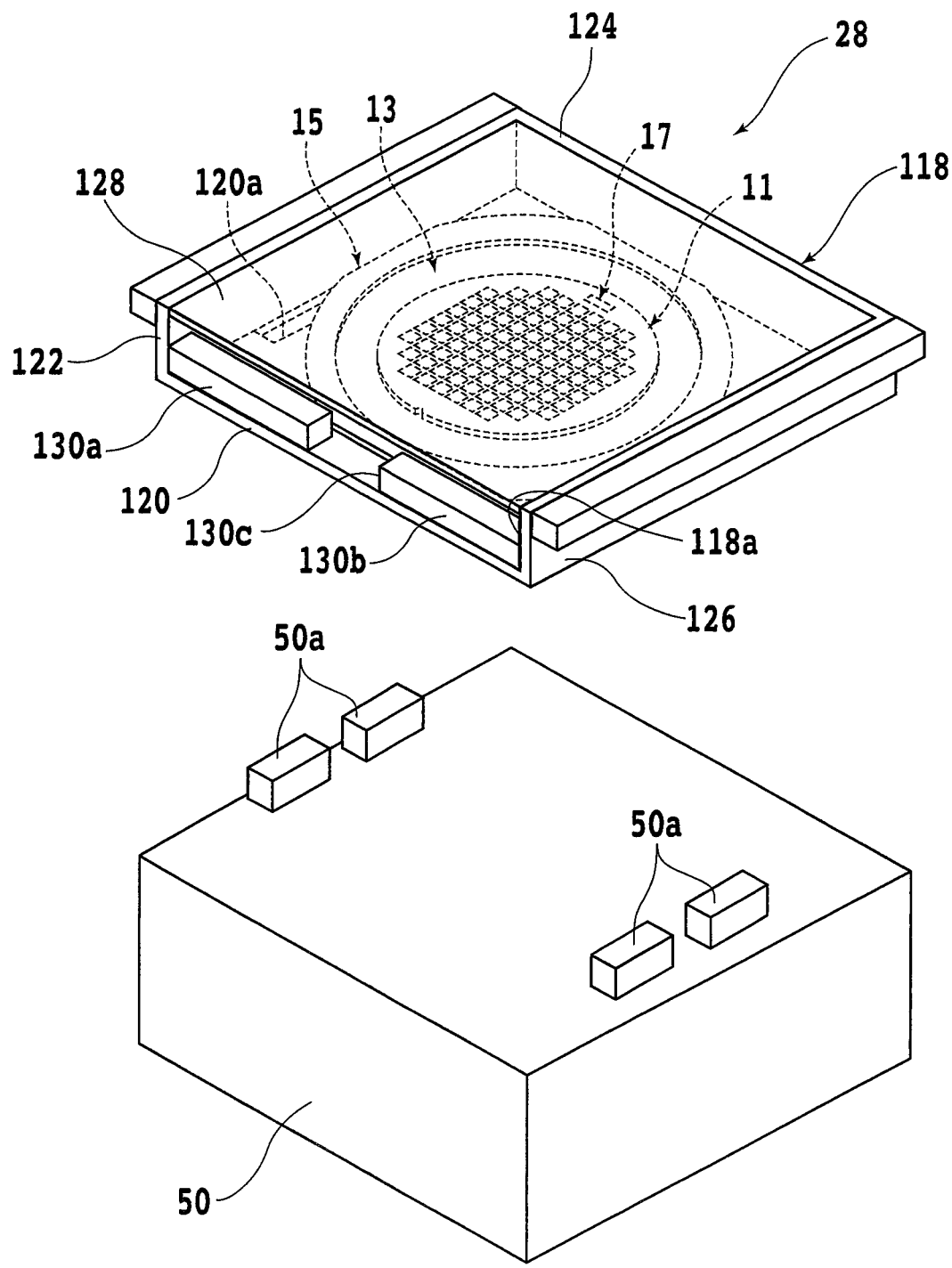
FIG. 12 is a perspective view illustrating the structure of the cassette and so forth.

Next, the structure of the cassette 28 and so forth used for conveyance of the workpiece 11 will be described. FIG. 12 is a perspective view illustrating the structure of the cassette 28 and so forth. The cassette 28 includes a box body 118 with a size that allows housing of the frame 15 that supports the workpiece 11. This box body 118 has a bottom plate 120 for supporting the workpiece 11 and the frame 15.

The bottom plate 120 is formed into a rectangular shape in plan view and the lower end sides of a side plate 122, a side plate 124, and a side plate 126 are fixed to positions corresponding to three sides of the bottom plate 120. A top plate 128 with the same shape as the bottom plate 120 is fixed to the upper end sides of the side plate 122, the side plate 124, and the side plate 126. That is, the box body 118 is formed into a hollow rectangular parallelepiped shape having an opening 118a in one of the four side surfaces.

It is desirable for the top plate 128 to be formed of a material such as resin or glass that allows transmission of visible light with a wavelength of approximately 360 nm to 830 nm. This makes it possible to discriminate the kind and so forth of the workpiece 11 housed in the box body 118 from the outside of the cassette 28, for example. When the kind and so forth of the workpiece 11 are discriminated, an identification code 17 such as a barcode drawn on the workpiece 11 may be read.

Furthermore, two movement restricting members 130a and 130b for restricting movement of the frame 15 housed in the box body 118 to the outside are disposed in a region on the bottom plate 120 on the side of the opening 118a. The two movement restricting members 130a and 130b are each formed into a rectangular parallelepiped shape and are disposed in such a manner that the longitudinal direction of the respective movement restricting members 130a and 130b is along the lower edge of the opening 118a.

The height of the two movement restricting members 130a and 130b is lower than the height of the opening 118a and a gap for carrying in and out the workpiece 11 and the frame 15 is formed between the respective movement restricting members 130a and 130b and the top plate 128. The two movement restricting members 130a and 130b are not in contact with each other. That is, a predetermined gap 130c is formed between the movement restricting member 130a and the movement restricting member 130b.

At part of the bottom plate 120, plural openings 120a that penetrate this bottom plate 120 in the thickness direction and have a rectangular shape in plan view are formed. Each opening 120a is made in a region directly below the frame 15 housed in the box body 118, for example. That is, each opening 120a is formed at a position overlapping with the frame 15 housed in the box body 118 in plan view.

As illustrated in FIG. 12, for example, plural protrusions 50a that correspond to the shape of the opening 120a and have a rectangular parallelepiped shape are disposed on the upper surface of the cassette support base 50 which the cutting apparatus 4 has. Each protrusion 50a is disposed at the position corresponding to the opening 120a of the cassette 28 placed on the upper surface of the cassette support base 50. Thus, for example, when the cassette 28 on the automated workpiece conveying vehicle 10 is conveyed by the cassette conveying arm 94 and is placed on the upper surface of the cassette support base 50, the protrusions 50a are inserted into the openings 120a of this cassette 28.

As a result, the frame 15 housed in the cassette 28 is pushed up to a position higher than the movement restricting members 130a and 130b relatively by the protrusions 50a, and the state in which the frame 15 can be carried out and in from the gap between the movement restricting members 130a and 130b and the top plate 128 is obtained. There is no particular limit to the shape and so forth of the openings 120a and the protrusions 50a. Furthermore, although only the cassette support base 50 which the cutting apparatus 4 has is exemplified in FIG. 12, the structure of the second cassette support base 26 which the stock unit 8 has and so forth are also the same, for example.

Figure 13A:
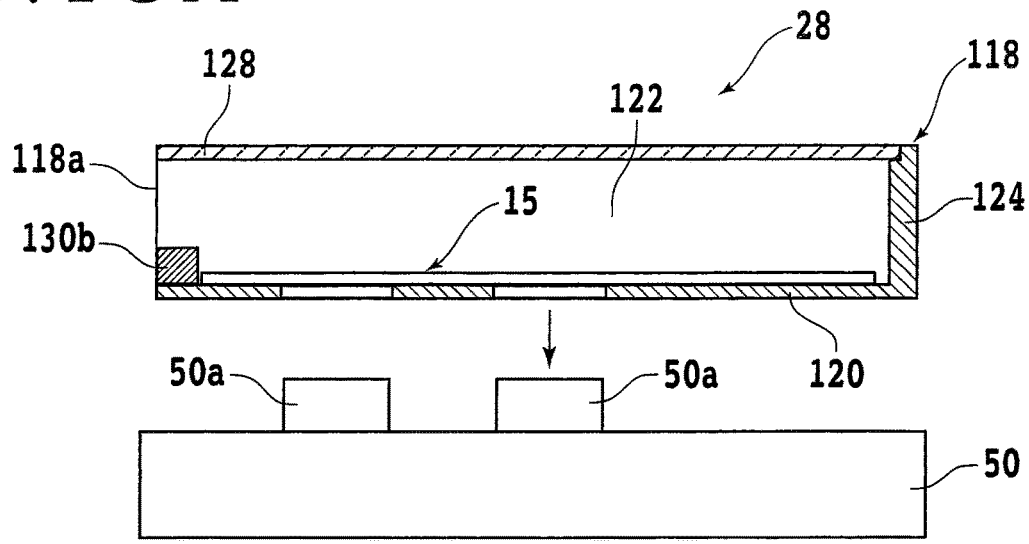
FIG. 13A, FIG. 13B, and FIG. 13C are sectional views illustrating how a frame that supports a workpiece is carried out from the cassette.
Figure 13B:
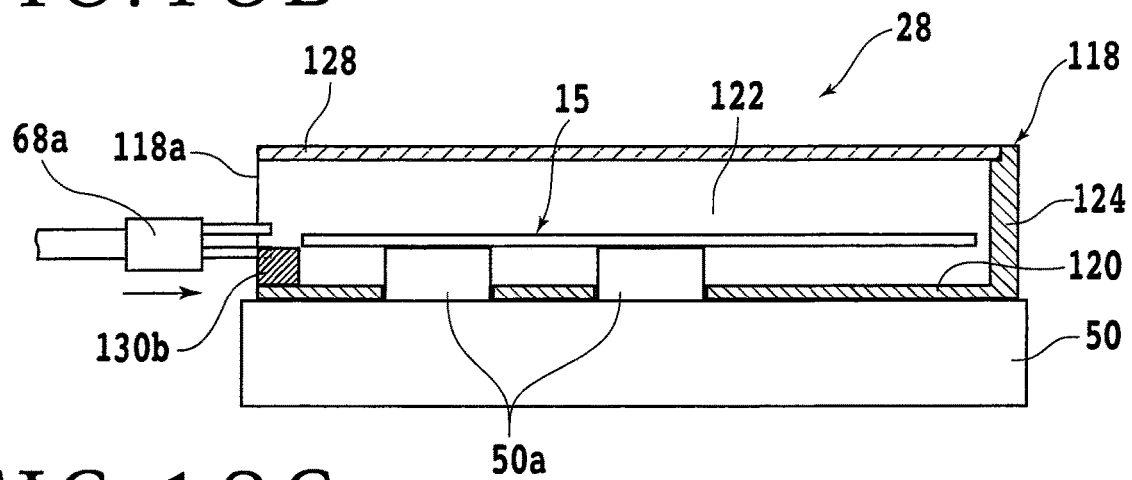
Figure 13C:
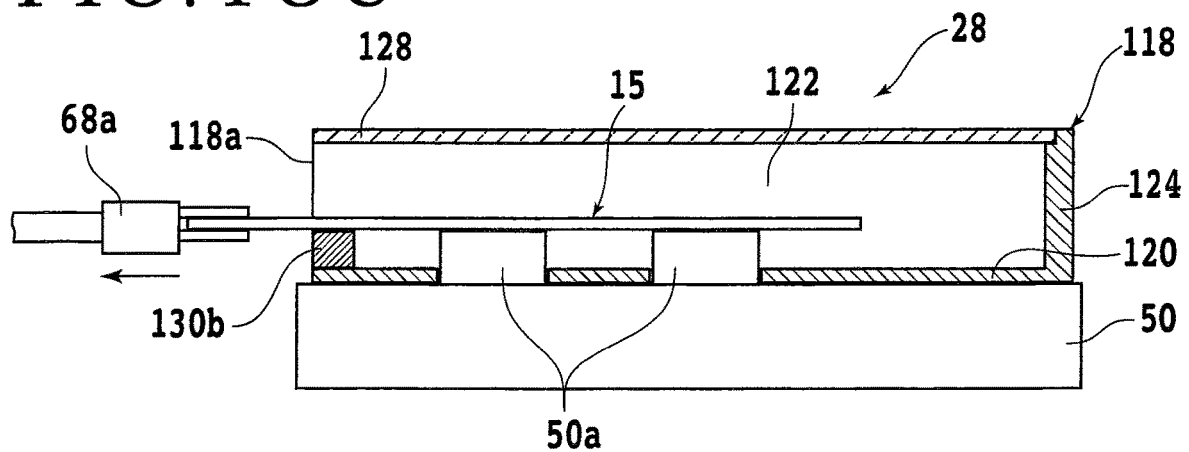

FIG. 13A, FIG. 13B, and FIG. 13C are sectional views illustrating how the frame 15 that supports the workpiece 11 is carried out from the cassette 28. For example, when the frame 15 is carried out from the cassette 28 in the cutting apparatus 4, the cassette 28 is placed on the upper surface of the cassette support base 50 in such a manner that the protrusions 50a are inserted into the openings 120a as illustrated in FIG. 13A. As a result, the frame 15 housed in the cassette 28 is pushed up to a position higher than the movement restricting members 130a and 130b relatively by the protrusions 50a.

Next, the relative height between the cassette support base 50 and the grasping mechanism 68a is adjusted in such a manner that the height of the upper surface of the protrusions 50a of the cassette support base 50 becomes substantially the same as that of the grasping mechanism 68a of the first conveying unit 68. Then, as illustrated in FIG. 13B, the grasping mechanism 68a of the first conveying unit 68 is inserted from the opening 118a into the cassette 28. Specifically, the first conveying unit 68 is horizontally moved and the grasping mechanism 68a is inserted into the gap 130c between the movement restricting member 130a and the movement restricting member 130b.

Thereafter, the frame 15 is grasped by the grasping mechanism 68a, and the first conveying unit 68 is horizontally moved to draw this grasping mechanism 68a from the cassette 28 as illustrated in FIG. 13C. Thereby, the frame 15 is carried out from the cassette 28. The carried-out frame 15 is carried in to the chuck table 56 after the position is adjusted by the pair of guide rails 60, for example.

Figure 14:
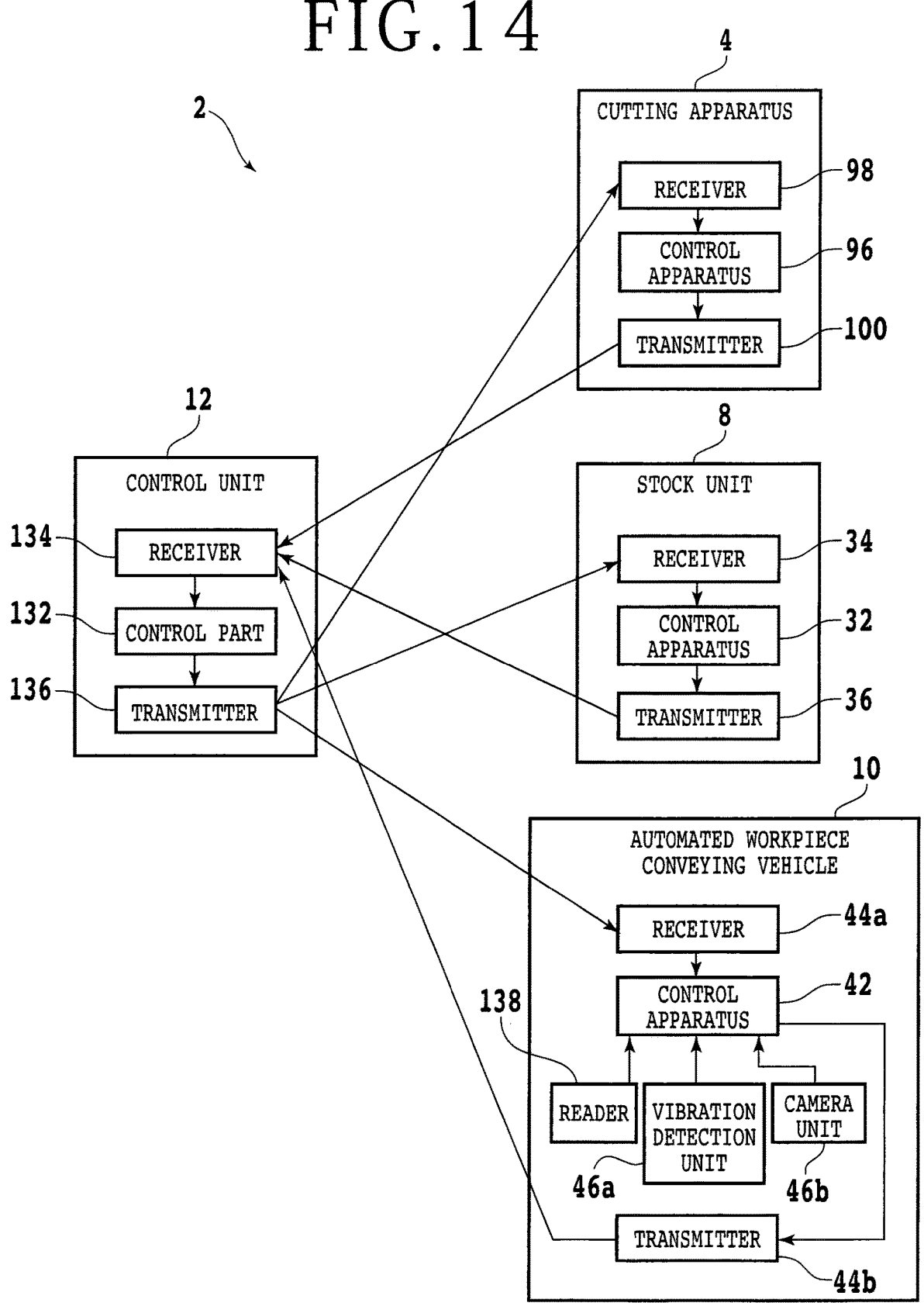
FIG. 14 is a functional block diagram for explaining an example of operation and so forth of the conveyance system according to Embodiment 1.

Next, an example of operation and so forth of the conveyance system 2 according to the present embodiment will be described. FIG. 14 is a functional block diagram for explaining the example of operation and so forth of the conveyance system 2. For example, when the situation in which the new workpiece 11 is necessary occurs, the control apparatus 96 of the cutting apparatus 4 generates a notification signal (workpiece request signal) for notifying this. The notification signal (workpiece request signal) generated by the control apparatus 96 is transmitted from the transmitter 100 to the control unit 12.

As illustrated in FIG. 14, the control unit 12 includes a control part (control signal generating part) 132 that generates a control signal for executing various kinds of control. To this control part 132, a receiver 134 that receives notification signals, vibration data, picked-up images, and so forth transmitted from the cutting apparatus 4, the stock unit 8, the automated workpiece conveying vehicle 10, and so forth and a transmitter 136 that transmits control signals to the cutting apparatus 4, the stock unit 8, the automated workpiece conveying vehicle 10, and so forth are connected.

When receiving the notification signal (workpiece request signal) transmitted from the transmitter 100 of the cutting apparatus 4, the receiver 134 of the control unit 12 sends it to the control part 132. When checking the notification signal (workpiece request signal) from the cutting apparatus 4, the control part 132 issues, to the automated workpiece conveying vehicle 10, an instruction to wait at a position at which the workpiece 11 can be received from the stock unit 8. Specifically, the control part 132 generates a control signal (first wait instruction signal) equivalent to this instruction and sends it from the transmitter 136 to the automated workpiece conveying vehicle 10.

When receiving the control signal (first wait instruction signal) from the control unit 12, the receiver 44a of the automated workpiece conveying vehicle 10 sends it to the control apparatus 42. The control apparatus 42 controls operation of the wheels (traveling mechanism) 40 and so forth based on this control signal (first wait instruction signal) and causes the automated workpiece conveying vehicle 10 to travel along the conveyance passage 6.

During traveling of the automated workpiece conveying vehicle 10, it is desirable to detect vibration of the chassis 38 or the like and record the vibration as vibration data by the vibration detection unit 46a. This makes it possible, for example, to confirm the state of the conveyance passage 6 (for example, ruggedness (projection and recess) of the conveyance passage 6, defective fixation, or the like) in the course of movement of the automated workpiece conveying vehicle 10 to the vicinity of the stock unit 8.

Similarly, the ambient environment of the automated workpiece conveying vehicle 10 or the conveyance passage 6 may be imaged, and the picked-up image may be recorded, by the camera unit 46b. In this case, the status of the ambient environment of the automated workpiece conveying vehicle 10 or the conveyance passage 6 during traveling can be confirmed later. Note that the vibration data recorded in the vibration detection unit 46a and the picked-up image recorded in the camera unit 46b are transmitted from the transmitter 44b to the control unit 12, as required.

Upon receiving the vibration data or the like from the automated workpiece conveying vehicle 10, the receiver 134 of the control unit 12 sends it to the control part 132. The control part 132 determines the state of the conveyance passage 6 on the basis of the vibration data or the like received from the automated workpiece conveying vehicle 10. For example, in the case where vibration in excess of a first threshold is detected during traveling, the control part 132 determines that the conveyance passage 6 has ruggedness (projection and recess).

In addition, for instance, in the case where vibration of a comparatively long period is detected during traveling, the control part 132 determines that the conveyance passage 6 is not properly fixed in relation to the cutting apparatus 4. The results of determination are utilized, for example, for maintenance of the conveyance passage 6 or the like. Naturally, the control part 132 may notify the operator of the determination results by a beep sound, a warning lamp or the like. In addition, the control part 132 can stop the conveyance of the workpiece 11 on the basis of the determination results.

As illustrated in FIG. 14, a reader 138 for reading information of the information providing part 102b set on the conveyance passage 6 is connected to the control apparatus 42 of the automated workpiece conveying vehicle 10. Thus, the control apparatus 42 can check the position of the automated workpiece conveying vehicle 10 by reading the information of the information providing part 102b by the reader 138. Note that in the case where an identification code such as a two-dimensional code is used as the information providing part 102b, the camera unit 46b may be provided with the function of this reader 138, and the reader 138 may be omitted.

When confirming that the automated workpiece conveying vehicle 10 has moved to near the stock unit 8, the control apparatus 42 stops the wheels 40 and so forth. Furthermore, the control apparatus 42 generates a notification signal (first standby signal) for notifying that the automated workpiece conveying vehicle 10 is waiting at a position at which the workpiece 11 can be received. The notification signal (first standby signal) generated by the control apparatus 42 is transmitted from the transmitter 44b to the control unit 12.

When receiving the notification signal (first standby signal) transmitted from the transmitter 44b of the automated workpiece conveying vehicle 10, the receiver 134 of the control unit 12 sends it to the control part 132. When checking the notification signal (first standby signal) from the automated workpiece conveying vehicle 10, the control part 132 issues, to the stock unit 8, an instruction to convey the workpiece 11 to the automated workpiece conveying vehicle 10. Specifically, the control part 132 generates a control signal (first conveyance instruction signal) equivalent to this instruction and sends it from the transmitter 136 to the stock unit 8.

When receiving the control signal (first conveyance instruction signal) from the control unit 12, the receiver 34 of the stock unit 8 sends it to the control apparatus 32. The control apparatus 32 controls operation of the cassette conveying arm 30 and so forth based on this control signal (first conveyance instruction signal) to place the cassette 28 in which the workpiece 11 is housed on the chassis 38 of the automated workpiece conveying vehicle 10.

When the conveyance of the cassette 28 to the automated workpiece conveying vehicle 10 has been completed, the control apparatus 32 generates a notification signal (first conveyance completion signal) for notifying that the conveyance of the cassette 28 to the automated workpiece conveying vehicle 10 has been completed. The notification signal (first conveyance completion signal) generated by the control apparatus 32 is transmitted from the transmitter 36 to the control unit 12.

When receiving the notification signal (first conveyance completion signal) transmitted from the transmitter 36 of the stock unit 8, the receiver 134 of the control unit 12 sends it to the control part 132. When checking the notification signal (first conveyance completion signal) from the stock unit 8, the control part 132 issues, to the automated workpiece conveying vehicle 10, an instruction to move to a position at which the workpiece 11 can be transferred to the cutting apparatus 4 and wait. Specifically, the control part 132 generates a control signal (second wait instruction signal) equivalent to this instruction and sends it from the transmitter 136 to the automated workpiece conveying vehicle 10.

When receiving the control signal (second wait instruction signal) from the control unit 12, the receiver 44a of the automated workpiece conveying vehicle 10 sends it to the control apparatus 42. The control apparatus 42 controls operation of the wheels 40 and so forth based on this control signal (second wait instruction signal) and causes the automated workpiece conveying vehicle 10 to travel along the conveyance passage 6.

During traveling of the automated workpiece conveying vehicle 10, vibration of the chassis 38 or the like is detected and is recorded as vibration data by the vibration detection unit 46a. This makes it possible, for example, to detect an accident such as collision of the automated workpiece conveying vehicle 10. In addition, it becomes possible to confirm the state of the conveyance passage 6 in the course of movement of the automated workpiece conveying vehicle 10 to the vicinity of the cutting apparatus 4.

Similarly, it is recommendable to image the ambient environment of the automated workpiece conveying vehicle 10 or the conveyance passage 6 and record the picked-up image by the camera unit 46b. In this case, the status of the ambient environment of the automated workpiece conveying vehicle 10 or the conveyance passage 6 during traveling can be confirmed later. Note that the vibration data recorded in the vibration detection unit 46a and the picked-up image recorded in the camera unit 46b are transmitted from the transmitter 44b to the control unit 12, as required.

Upon receiving the vibration data or the like from the automated workpiece conveying vehicle 10, the receiver 134 of the control unit 12 sends it to the control part 132. The control part 132 determines generation of an accident such as collision, the state of the conveyance passage 6 or the like on the basis of the vibration data or the like received from the automated workpiece conveying vehicle 10. For example, in the case where large vibration in excess of a first threshold is detected during traveling, the control part 132 determines that the conveyance passage 6 has ruggedness (projection and recess).

In addition, for example, in the case where an extremely large vibration in excess of a second threshold greater than the first threshold is detected during traveling, the control part 132 determines that an accident such as collision has occurred in the automated workpiece conveying vehicle 10. Besides, for example, in the case where vibration of a comparatively long period is detected during traveling, the control part 132 determines that the conveyance passage 6 is not properly fixed in relation to the cutting apparatus 4.

The results of detection are utilized, for example, for maintenance of the conveyance passage 6, selection of the workpiece 11, and so on. Naturally, the control part 132 may notify the operator of the determination results by a beep sound, a warning lamp or the like. In addition, the control part 132 can stop the conveyance of the workpiece 11 on the basis of the determination results.

When confirming that the automated workpiece conveying vehicle 10 has moved to near the cutting apparatus 4, the control apparatus 42 stops the wheels 40 and so forth. Furthermore, the control apparatus 42 generates a notification signal (second standby signal) for notifying that the automated workpiece conveying vehicle 10 is waiting at a position at which the workpiece 11 can be transferred to the cutting apparatus 4. The notification signal (second standby signal) generated by the control apparatus 42 is transmitted from the transmitter 44b to the control unit 12.

When receiving the notification signal (second standby signal) transmitted from the transmitter 46 of the automated workpiece conveying vehicle 10, the receiver 134 of the control unit 12 sends it to the control part 132. When checking the notification signal (second standby signal) from the automated workpiece conveying vehicle 10, the control part 132 issues, to the cutting apparatus 4, an instruction to convey the workpiece 11 from the automated workpiece conveying vehicle 10. Specifically, the control part 132 generates a control signal (second conveyance instruction signal) equivalent to this instruction and sends it from the transmitter 136 to the cutting apparatus 4.

When receiving the control signal (second conveyance instruction signal) from the control unit 12, the receiver 98 of the cutting apparatus 4 sends it to the control apparatus 96. The control apparatus 96 controls operation of the cassette conveying arm 94 and so forth based on this control signal (second conveyance instruction signal) to carry out the cassette 28 in which the workpiece 11 is housed from the chassis 38 of the automated workpiece conveying vehicle 10 and place the cassette 28 on the cassette support base 50.

When the conveyance of the cassette 28 to the cutting apparatus 4 has been completed, the control apparatus 96 generates a notification signal (second conveyance completion signal) for notifying that the conveyance of the cassette 28 to the cutting apparatus 4 has been completed, for example. The notification signal (second conveyance completion signal) generated by the control apparatus 96 is transmitted from the transmitter 100 to the control unit 12.

By such a procedure, the workpieces 11 housed in the stock unit 8 can be conveyed to an arbitrary cutting apparatus 4 one by one. Although the procedure when the workpiece 11 is conveyed to the cutting apparatus 4 is mainly described here, the procedure when the cassette 28 is collected from the cutting apparatus 4, or the like, is also the same.

Furthermore, the above-described procedure can be changed within a range in which the workpiece 11 can be properly conveyed. For example, plural steps included in the above-described procedure may be simultaneously executed, and the order of the steps may be changed within a range in which no trouble is caused in the conveyance of the workpiece 11. Similarly, an arbitrary step may be changed or omitted within a range in which no trouble is caused in the conveyance of the workpiece 11.

As described above, the conveyance system 2 according to the present embodiment includes the conveyance passage 6 set across plural cutting apparatuses (processing apparatuses) 4, the automated workpiece conveying vehicle 10 including the chassis (workpiece support part) 38, the wheels (traveling mechanism) 40, and the receiver 44a, and the stock unit 8 including the cassette conveying arm (workpiece conveying part) 30 and the receiver 34.

Thus, the workpiece 11 can be conveyed to each of the plural cutting apparatuses 4 by conveying the workpiece 11 housed in the cassette (workpiece stocker) 18 to the chassis 38 of the automated workpiece conveying vehicle 10 by the cassette conveying arm 30 and causing this automated workpiece conveying vehicle 10 to travel on the conveyance passage 6. Furthermore, in the conveyance system 2 according to the present embodiment, the conveyance passage 6 is set in a space directly above the cutting apparatus 4. For this reason, the structures of the side surfaces of each cutting apparatus 4 do not need to be considered when this conveyance passage 6 is designed. That is, construction of the conveyance system 2 becomes easy.

Further, the automated workpiece conveying vehicle 10 according to the present embodiment includes the vibration detection unit 46a that detects vibration of the chassis 38 and records the vibration as vibration data, in addition to the chassis 38, the wheels 40 and the receiver 44a. Therefore, it is possible to detect an accident such as collision and to determine the state of the conveyance passage 6 based on the vibration detected by the vibration detection unit 46a. In addition, since the automated workpiece conveying vehicle 10 according to the present embodiment includes the camera unit 46b that images the ambient environment or the conveyance passage 6 and records the picked-up image, the status of the ambient environment of the automated workpiece conveying vehicle 10 or the conveyance passage 6 during traveling can be confirmed later.

Embodiment 2

In the present embodiment, a conveyance system that treats the cutting blade 82 and so forth as the target of conveyance in addition to the workpiece 11 will be described. The basic configuration of the conveyance system according to the present embodiment is the same as the basic configuration of the conveyance system 2 according to Embodiment 1. Thus, a constituent element common to the conveyance system 2 of Embodiment 1 is given the same numeral, and the detailed description is omitted.

Figure 15:
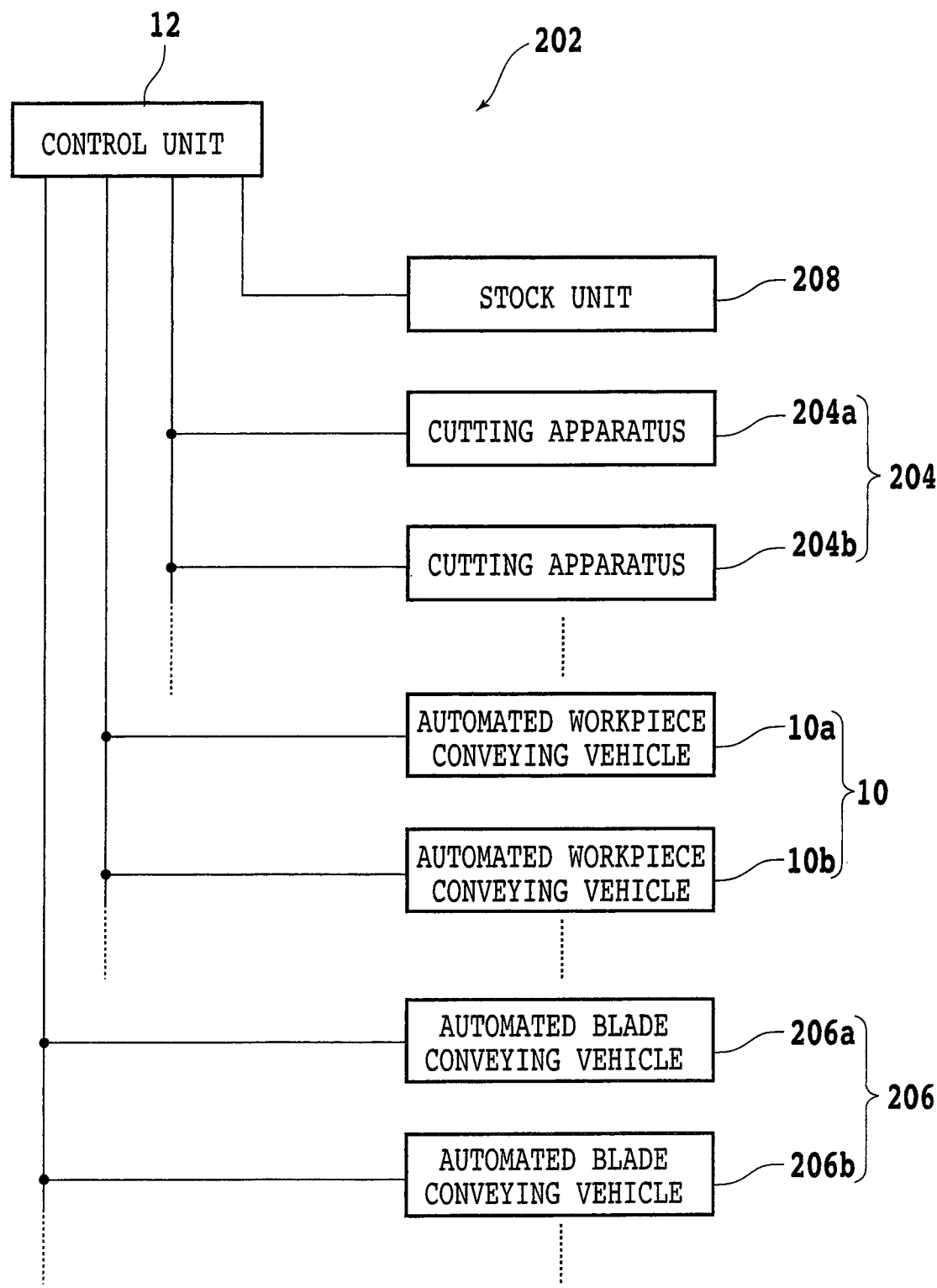
FIG. 15 is a functional block diagram illustrating an example of the connection relationship of a conveyance system according to Embodiment 2.

FIG. 15 is a functional block diagram illustrating an example of the connection relationship of a conveyance system 202 according to the present embodiment. As illustrated in FIG. 15, the automated workpiece conveying vehicles 10, cutting apparatuses 204, automated blade conveying vehicles 206, and a stock unit 208 are wirelessly connected to the control unit 12 of the conveyance system 202 according to the present embodiment.

The automated blade conveying vehicle 206 travels on the conveyance passage 6 (see FIG. 16 and so forth) similarly to the automated workpiece conveying vehicle 10 and conveys the cutting blade 82 to each cutting apparatus 204. The stock unit 208 is configured to be capable of housing the cutting blades 82 supplied to the respective cutting apparatuses 204 in addition to plural workpieces 11.

In FIG. 15, two automated workpiece conveying vehicles 10a and 10b, two cutting apparatus 204a and 204b, and two automated blade conveying vehicles 206a and 206b are illustrated for convenience of description. However, there is no limit to the number of pieces regarding each of them. Furthermore, the control unit 12 may be connected to the automated workpiece conveying vehicles 10, the cutting apparatuses 204, the automated blade conveying vehicles 206, the stock unit 208, and so forth in a wired manner.

Figure 16:
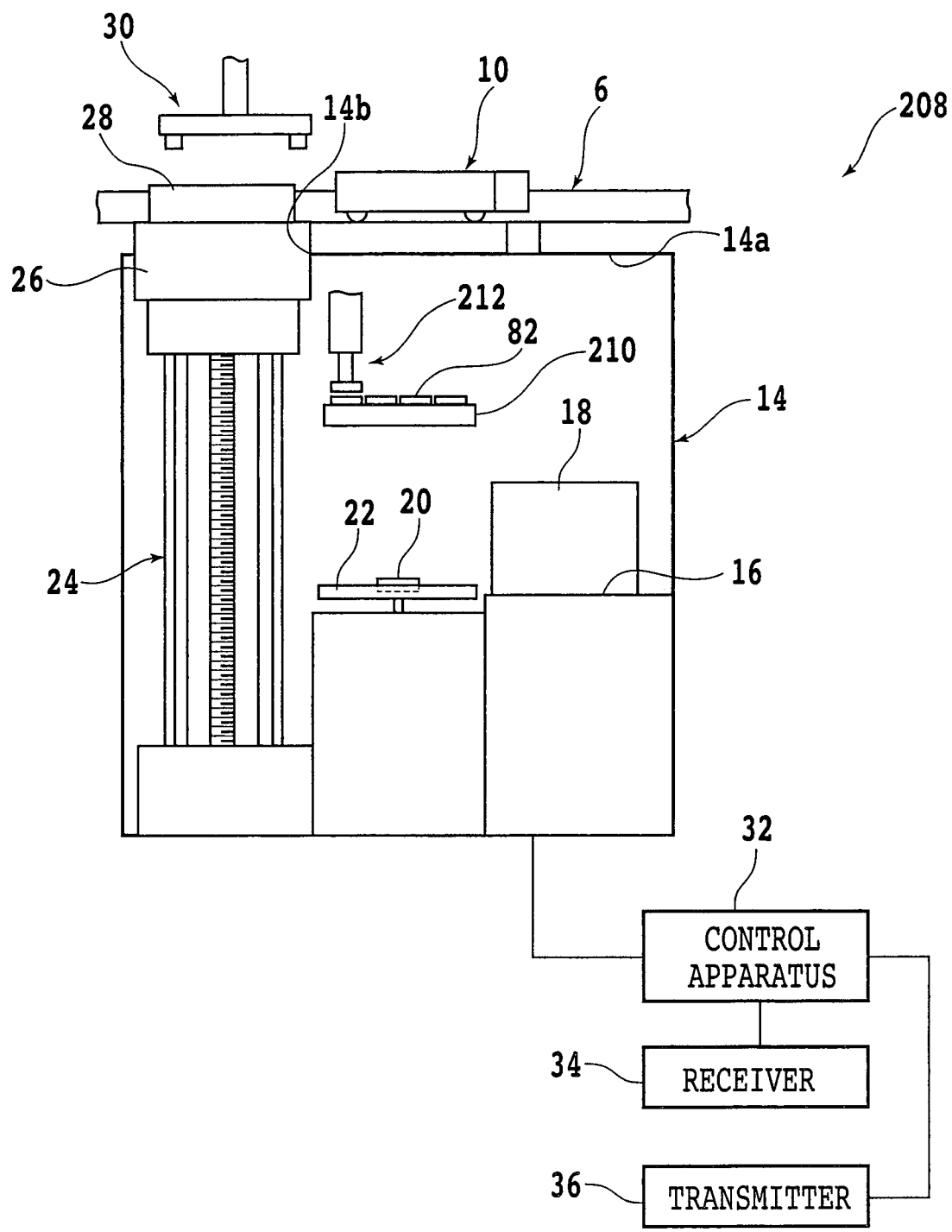
FIG. 16 is a side view illustrating a configuration example of a stock unit according to Embodiment 2.

FIG. 16 is a side view illustrating a configuration example of the stock unit 208 according to Embodiment 2. As illustrated in FIG. 16, the basic configuration of the stock unit 208 is the same as the basic configuration of the stock unit 8 according to Embodiment 1. However, a blade stocker 210 for housing plural cutting blades 82 is disposed in the stock unit 208 according to the present embodiment.

The blade stocker 210 is formed into a tray shape whose upper surface side is segmented into plural regions, for example. The cutting blade 82 is housed in each region. Furthermore, near this blade stocker 210, a blade conveying arm (blade conveying part) 212 that conveys the cutting blade 82 between the blade stocker 210 and the automated blade conveying vehicle 206 is disposed.

Figure 17:
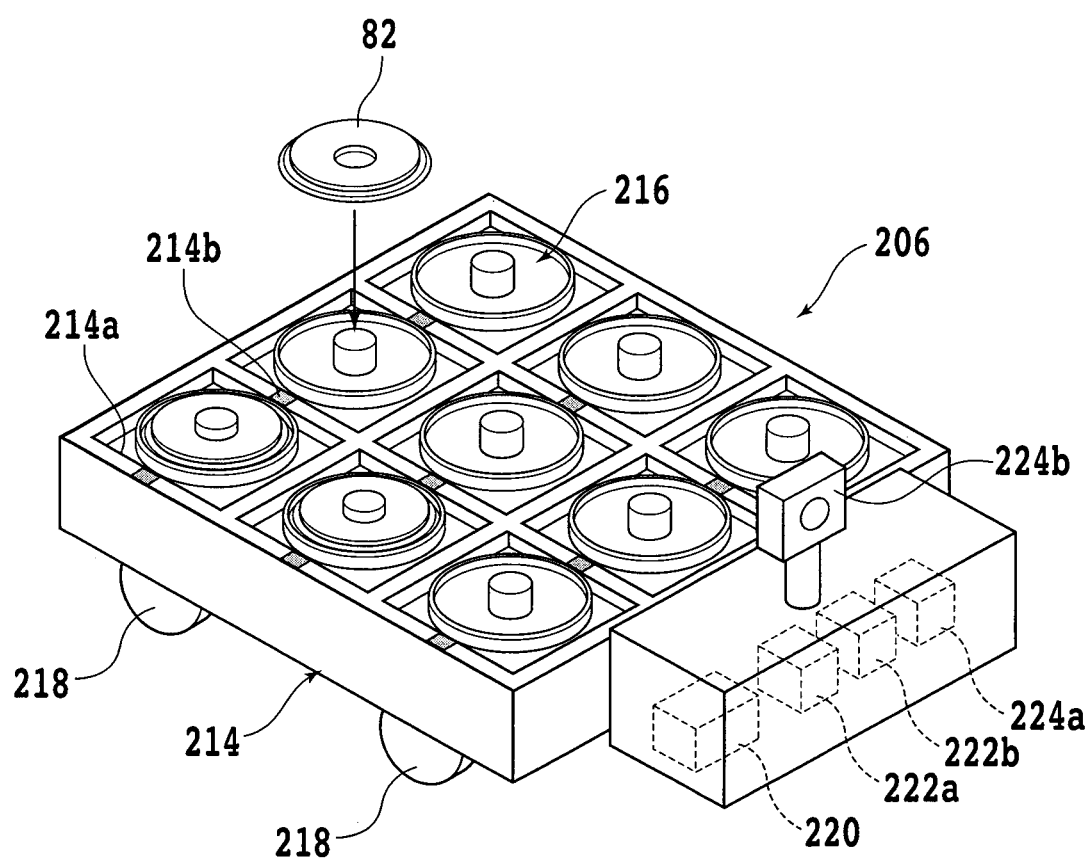
FIG. 17 is a perspective view illustrating a configuration example of an automated blade conveying vehicle.

FIG. 17 is a perspective view illustrating a configuration example of the automated blade conveying vehicle 206. As illustrated in FIG. 17, the automated blade conveying vehicle 206 includes a chassis (blade support part) 214 with a tray shape. Plural recesses 214a corresponding to the size of the cutting blade 82 are formed on the upper surface side of the chassis 214 and a blade case 216 that can house the cutting blade 82 is disposed in each recess 214a.

The cutting blade 82 conveyed by the blade conveying arm 212 is placed on the blade case 216 disposed in the recess 214a of this chassis 214. An information providing part 214b such as a wireless tag or identification code is set at a position corresponding to each blade case 216 (recess 214a) of the chassis 214. Thus, the cutting blade 82 housed in each blade case 216 can be easily identified.

Plural (in the present embodiment, four) wheels (traveling mechanism) 218 are attached to the lower surface side of the chassis 214. Each wheel 218 is coupled to a rotational drive source such as a motor and rotates. By rotating these wheels 218 by the rotational drive source, the automated blade conveying vehicle 206 travels on the conveyance passage 6. As the wheels 218, so-called Mecanum wheels in which plural inclined barrel-shaped (cylinder-shaped) rotating bodies are attached to the outer circumferential surface in contact with the conveyance passage 6, or the like, can be used.

A control apparatus 220 that controls operation of the automated blade conveying vehicle 206 is disposed on a side surface of the chassis 214. To this control apparatus 220, a receiver 222a that receives a signal for control (control signal) transmitted from the control unit 12 and a transmitter 222b that transmits a signal for notification (notification signal) to the control unit 12 are connected. The control apparatus 220 controls the operation (traveling) of the automated blade conveying vehicle 206 based on the signal received by the receiver 222a. Furthermore, the control apparatus 220 transmits a necessary signal to the control unit 12 through the transmitter 222b.

Further, a vibration detection unit 224a for detecting vibration of the chassis 214 or the like and recording the vibration as vibration data is connected to the control apparatus 220. There is no special limit to the specific configuration of the vibration detection unit 224a, for example, a vibration detection unit 224a including a vibration detection element composed of MEMS can be used.

During traveling of the automated blade conveying vehicle 206, for example, vibration of the chassis 214 or the like is constantly detected and recorded as vibration data by the vibration detection unit 224a. The control apparatus 220 transmits the vibration data, recorded in the vibration detection unit 224a, from the transmitter 222b to the control unit 12, as required.

In addition, a camera unit 224b for imaging the ambient environment of the automated blade conveying vehicle 206 or the conveyance passage 6 and recording an image picked up is connected to the control apparatus 220. There is no special limit to the specific configuration of the camera unit 224b. For example, a camera unit 224b including an image sensor composed of CCD or CMOS can be used.

During traveling of the automated blade conveying vehicle 206, for example, the ambient environment of the automated blade conveying vehicle 206 or the conveyance passage 6 is constantly imaged, and the picked-up image is recorded, by the camera unit 224b. The control apparatus 220 transmits the picked-up image, recorded in the camera unit 224b, from the transmitter 222b to the control unit 12, as required.

Note that the timing for transmitting the vibration data or the picked-up image to the control unit 12 is set arbitrarily. For example, the control apparatus 220 may transmits the vibration data or the picked-up image from the transmitter 222b to the control unit 12 in the case where a shock whose magnitude is not less than a threshold is detected by the vibration detection unit 224a. Besides, the vibration data or the picked-up image may be periodically transmitted at a predetermined timing, or may be transmitted on a real-time basis.

Figure 18:
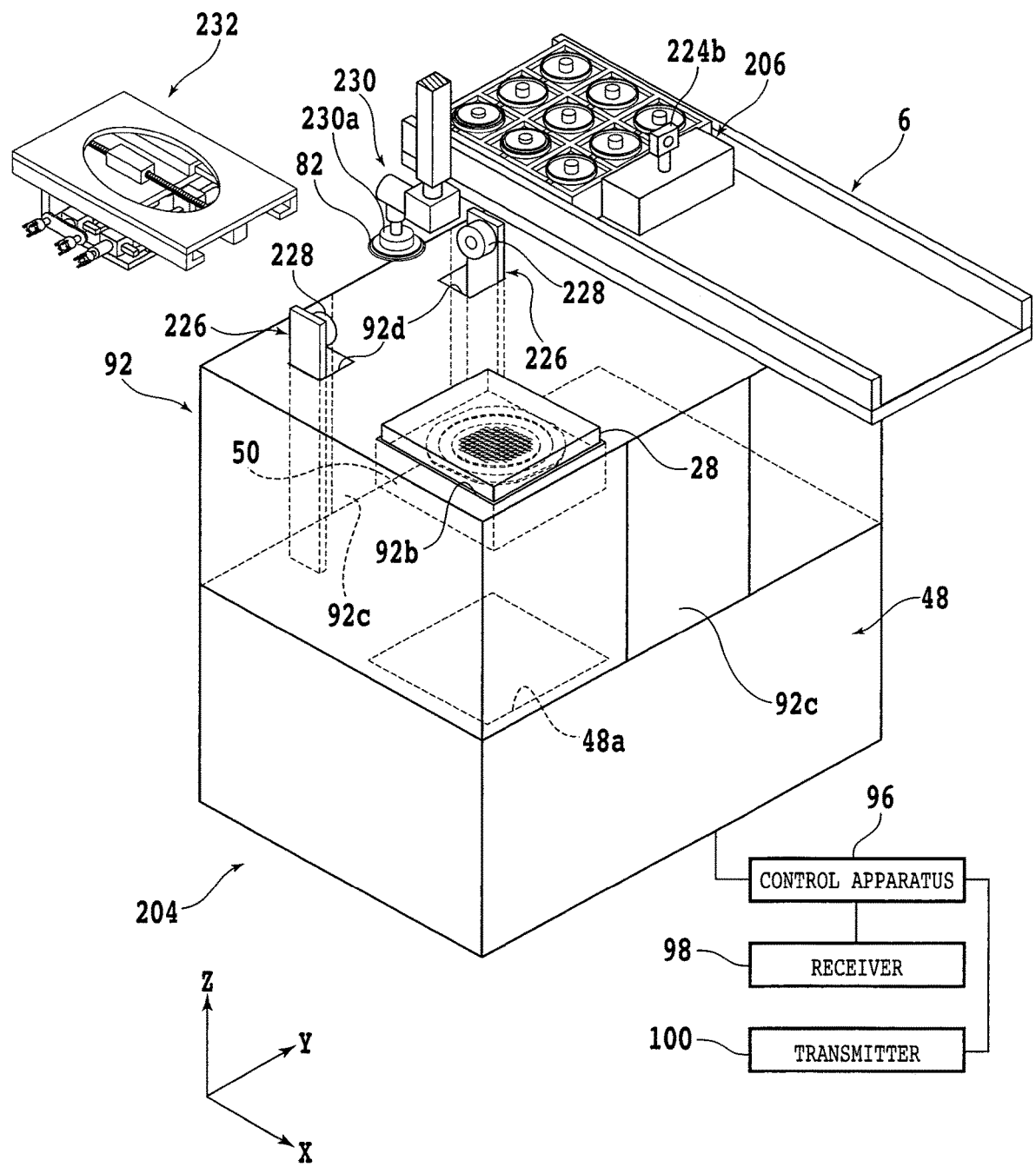
FIG. 18 is a perspective view illustrating the appearance of a cutting apparatus and so forth according to Embodiment 2.

FIG. 18 is a perspective view illustrating the appearance of the cutting apparatus 204 and so forth. As illustrated in FIG. 18, the basic configuration of the cutting apparatus 204 is the same as the basic configuration of the cutting apparatus 4 according to Embodiment 1. However, in this cutting apparatus 204, two openings 92d that vertically penetrate the ceiling 92a of the cover 92 are further made. Each opening 92d is formed with a size that allows the cutting blade 82 to pass through the opening 92d.

Furthermore, a blade raising-lowering mechanism 226 for raising and lowering the cutting blade 82 is disposed in each opening 92d. The blade raising-lowering mechanism 226 includes a blade holding part 228 that holds the cutting blade 82 and raises and lowers this blade holding part 228. Thus, when this blade holding part 228 is raised and lowered after the blade holding part 228 is caused to hold the cutting blade 82, the cutting blade 82 can be conveyed from the outside of the cover 92 to the inside or be conveyed from the inside of the cover 92 to the outside.

Over the ceiling 92a of the cover 92, a blade conveying arm 230 that conveys the cutting blade 82 between the blade holding part 228 included in the blade raising-lowering mechanism 226 and the automated blade conveying vehicle 206 that stops near the blade raising-lowering mechanism 226 is disposed. The blade conveying arm 230 includes a blade grasping part 230a that holds the cutting blade 82 and conveys the cutting blade 82 between the automated blade conveying vehicle 206 and the blade holding part 228 by rotating and raising and lowering this blade grasping part 230a.

A blade changer 232 that replaces the cutting blade 82 of the cutting unit 80 by automatic control is further disposed inside the cover 92 of the cutting apparatus 204. The blade changer 232 is connected to the control apparatus 96 together with the blade raising-lowering mechanism 226 and the blade conveying arm 230.

Figure 19:
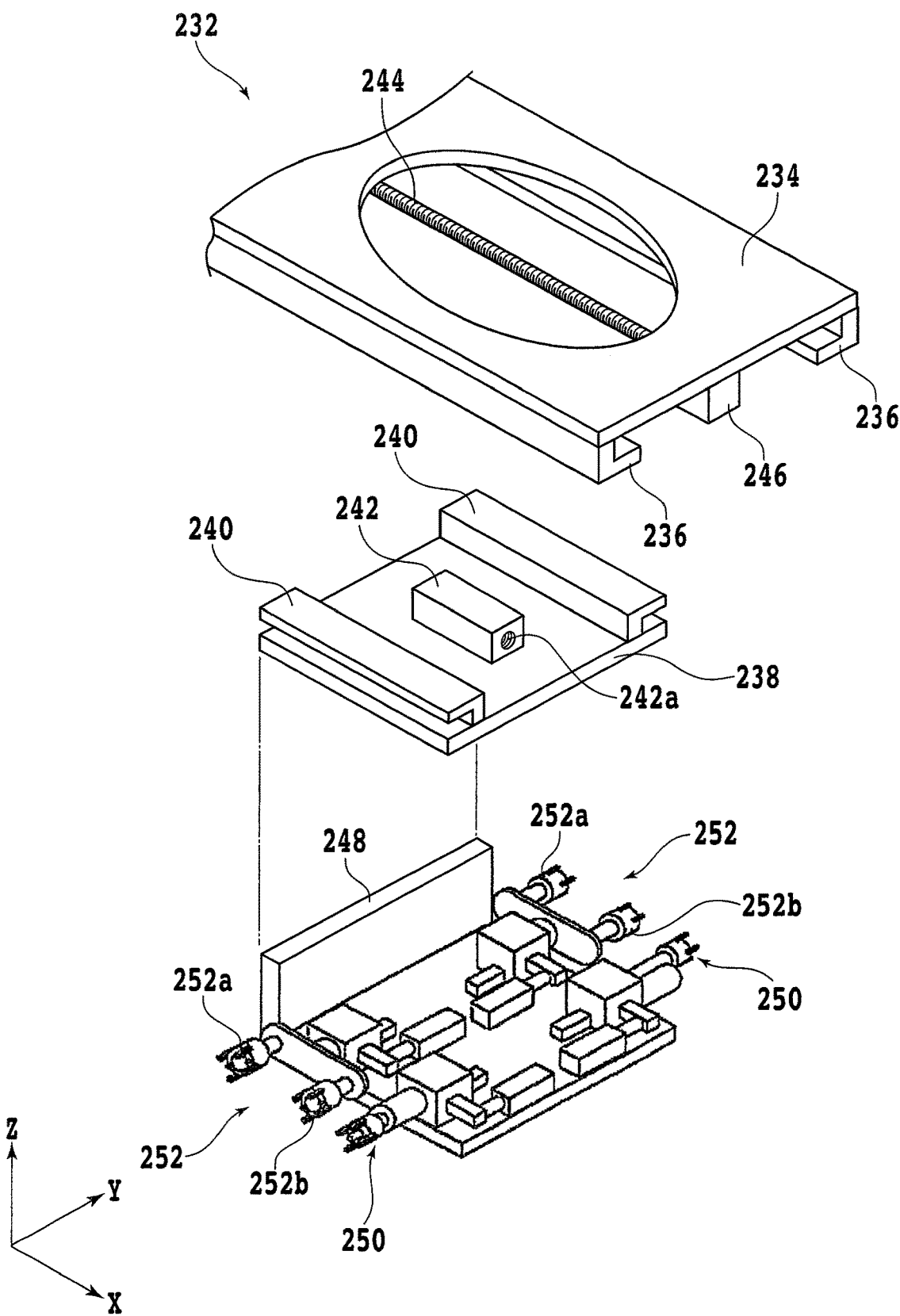
FIG. 19 is an exploded perspective view illustrating a configuration example of a blade changer.

FIG. 19 is an exploded perspective view illustrating a configuration example of the blade changer 232. This blade changer 232 includes a fixed plate 234 whose position is fixed relative to the pedestal 48, the cover 92, and so forth, for example. A pair of guide rails 236 that are long in the X-axis direction are disposed on the lower surface side of the fixed plate 234. A moving plate 238 is supported by the guide rails 236 in a slidable manner along the X-axis direction.

Brackets 240 corresponding to the shapes of the guide rails 236 are disposed at end parts of the moving plate 238 in the Y-axis direction and the moving plate 238 is supported by the guide rails 236 with the intermediary of these brackets 240. A nut part 242 is fixed to the upper surface of the moving plate 238. A ball screw 244 substantially parallel to the X-axis direction is inserted into a screw hole 242a of the nut part 242 in a rotatable manner.

A pulse motor 246 is coupled to one end of the ball screw 244. When the ball screw 244 is rotated by this pulse motor 246, the moving plate 238 moves in the X-axis direction along the guide rails 236. A changer support structure 248 is fixed to the lower surface side of the moving plate 238.

A pair of nut attaching-detaching mechanisms 250 for attaching and detaching a fixing nut (not illustrated) that fixes the cutting blade 82 to the cutting unit 80 are supported by the changer support structure 248. Each nut attaching-detaching mechanism 250 is configured to be capable of moving along the Y-axis direction and rotating around a rotation axis parallel to the Y-axis direction. By grasping and rotating the fixing nut by this nut attaching-detaching mechanism 250, the fixing nut can be attached to the cutting unit 80 or the fixing nut can be detached from the cutting unit 80.

Furthermore, a pair of blade replacement mechanisms 252 for replacing the cutting blade 82 are supported by the changer support structure 248. Each blade replacement mechanism 252 includes a first blade holding part 252a and a second blade holding part 252b that can each hold the cutting blade 82. This blade replacement mechanism 252 is configured to be capable of moving along the Y-axis direction and exchanging the positions of the first blade holding part 252a and the second blade holding part 252b in the X-axis direction.

When the cutting blade 82 is replaced by the blade changer 232, for example, the cutting blade 82 for replacement held by the blade holding part 228 of the blade raising-lowering mechanism 226 is received by the first blade holding part 252a. Then, the fixing nut is detached from the cutting unit 80 by the nut attaching-detaching mechanism 250. Furthermore, the cutting blade 82 mounted to the cutting unit 80 is detached from the cutting unit 80 by the second blade holding part 252b.

Thereafter, the positions of the first blade holding part 252a and the second blade holding part 252b are exchanged and the cutting blade 82 for replacement is attached to the cutting unit 80 by the first blade holding part 252a. Then, finally the fixing nut is attached to the cutting unit 80 by the nut attaching-detaching mechanism 250. The cutting blade 82 previously mounted to the cutting unit 80 is transferred from the second blade holding part 252b to the blade holding part 228 of the blade raising-lowering mechanism 226, for example.

Figure 20:
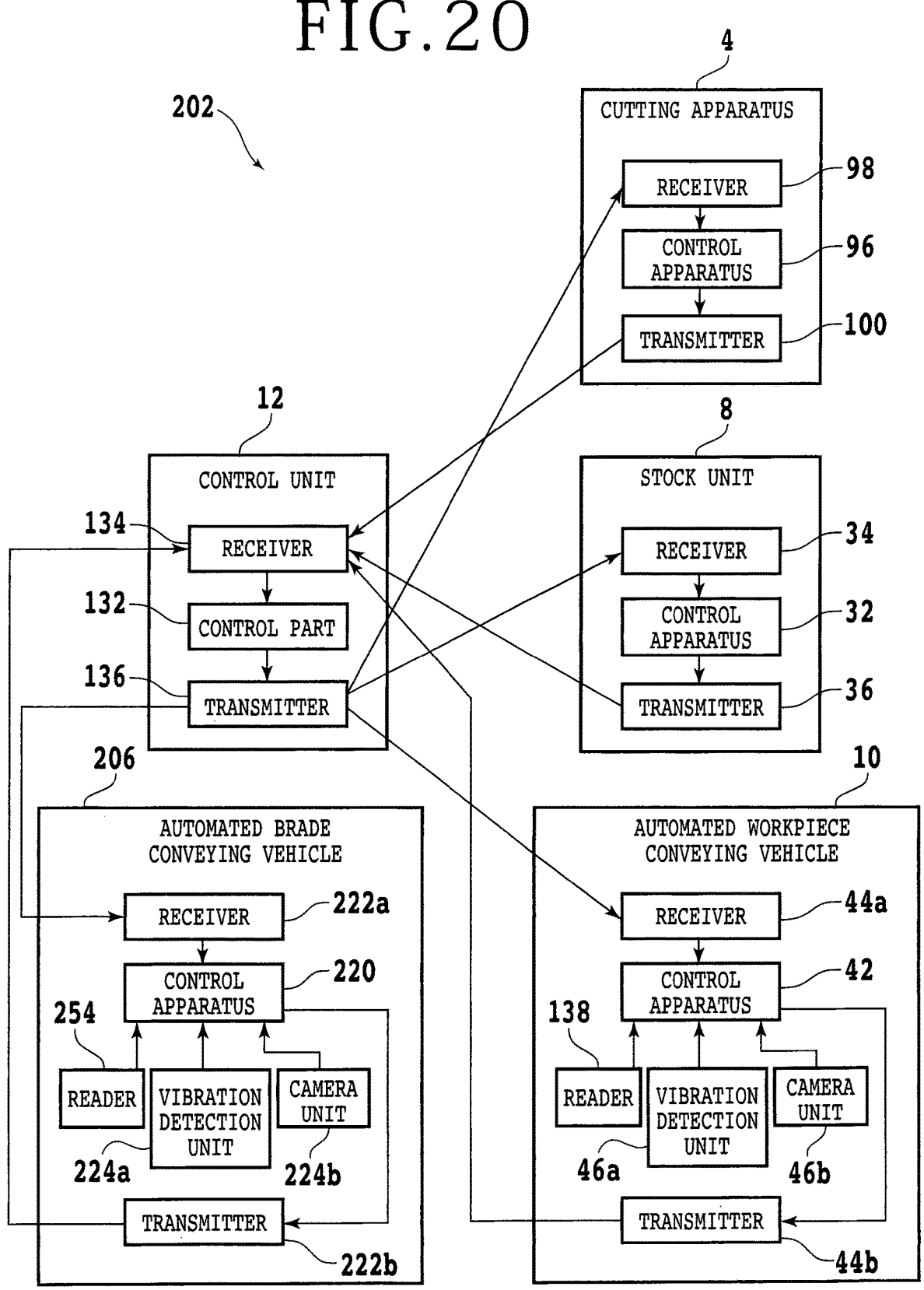
FIG. 20 is a functional block diagram for explaining an example of operation and so forth of the conveyance system according to Embodiment 2.

Next, an example of operation and so forth of the conveyance system 202 according to the present embodiment will be described. FIG. 20 is a functional block diagram for explaining the example of operation and so forth of the conveyance system 202. The operation relating to conveyance of the workpiece 11 is the same as Embodiment 1. Therefore, an example of operation relating to conveyance of the cutting blade 82 will be mainly described in the present embodiment.

For example, when the situation in which replacement of the cutting blade 82 is necessary occurs, the control apparatus 96 of the cutting apparatus 204 generates a notification signal (blade request signal) for notifying this. The notification signal (blade request signal) generated by the control apparatus 96 is transmitted from the transmitter 100 to the control unit 12.

When receiving the notification signal (blade request signal) transmitted from the transmitter 100 of the cutting apparatus 204, the receiver 134 of the control unit 12 sends it to the control part 132. When checking the notification signal (blade request signal) from the cutting apparatus 204, the control part 132 issues, to the automated blade conveying vehicle 206, an instruction to wait at a position at which the cutting blade 82 can be received from the stock unit 208. Specifically, the control part 132 generates a control signal (first wait instruction signal) equivalent to this instruction and sends it from the transmitter 136 to the automated blade conveying vehicle 206.

When receiving the control signal (first wait instruction signal) from the control unit 12, the receiver 222a of the automated blade conveying vehicle 206 sends it to the control apparatus 220. The control apparatus 220 controls operation of the wheels (traveling mechanism) 218 and so forth based on this control signal (first wait instruction signal) and causes the automated blade conveying vehicle 206 to travel along the conveyance passage 6.

During traveling of this automated blade conveying vehicle 206, it is desirable to detect vibration of the chassis 214 or the like and record the vibration as vibration data by the vibration detection unit 224a. This makes it possible, for example, to confirm the state of the conveyance passage 6 (for example, ruggedness (projection and recess) of the conveyance passage 6, defective fixation, or the like) in the course of movement of the automated blade conveying vehicle 206 to the vicinity of the stock unit 208.

Similarly, the ambient environment of the automated blade conveying vehicle 206 or the conveyance passage 6 may be imaged, and an image picked up may be recorded, by the camera unit 224b. In this case, the status of the ambient environment of the automated blade conveying vehicle 206 or the conveyance passage 6 during traveling can be confirmed later. Note that the vibration data recorded in the vibration detection unit 224a and the picked-up image recorded in the camera unit 224b are transmitted from the transmitter 222b to the control unit 12, as required.

Upon receiving the vibration data or the like from the automated blade conveying vehicle 206, the receiver 134 of the control unit 12 sends it to the control part 132. The control part 132 determines the state of the conveyance passage 6 on the basis of the vibration data received from the automated blade conveying vehicle 206. For example, in the case where large vibration in excess of a first threshold is detected during traveling, the control part 132 determines that the conveyance passage 6 has ruggedness (projection and recess).

In addition, for example, in the case where vibration of a comparatively long period is detected during traveling, the control part 132 determines that the conveyance passage 6 is not properly fixed in relation to the cutting apparatus 204. The results of determination are utilized, for example, for maintenance of the conveyance passage 6 or the like. Naturally, the control part 132 may notify the operator of the determination results by a beep sound, a warning lamp or the like. Besides, the control part 132 can stop the conveyance of the workpiece 11 or the cutting blade 82 on the basis of the determination results.

As illustrated in FIG. 20, a reader 254 for reading information of the information providing part 102b set on the conveyance passage 6 is connected to the control apparatus 220 of the automated blade conveying vehicle 206. Thus, the control apparatus 220 can check the position of the automated blade conveying vehicle 206 by reading the information of the information providing part 102b by the reader 254. Note that in the case where an identification code such as a two-dimensional code is used as the information providing part 102b, the camera unit 224b may be provided with the function of this reader 254, and the reader 254 may be omitted.

When confirming that the automated blade conveying vehicle 206 has moved to near the stock unit 208, the control apparatus 220 stops the wheels 218 and so forth. Furthermore, the control apparatus 220 generates a notification signal (first standby signal) for notifying that the automated blade conveying vehicle 206 is waiting at a position at which the cutting blade 82 can be received. The notification signal (first standby signal) generated by the control apparatus 220 is transmitted from the transmitter 222b to the control unit 12.

When receiving the notification signal (first standby signal) transmitted from the transmitter 222b of the automated blade conveying vehicle 206, the receiver 134 of the control unit 12 sends it to the control part 132. When checking the notification signal (first standby signal) from the automated blade conveying vehicle 206, the control part 132 issues, to the stock unit 208, an instruction to convey the cutting blade 82 to the automated blade conveying vehicle 206. Specifically, the control part 132 generates a control signal (first conveyance instruction signal) equivalent to this instruction and sends it from the transmitter 136 to the stock unit 208.

When receiving the control signal (first conveyance instruction signal) from the control unit 12, the receiver 34 of the stock unit 208 sends it to the control apparatus 32. The control apparatus 32 controls operation of the blade conveying arm 212 and so forth based on this control signal (first conveyance instruction signal) to carry out the cutting blade 82 from the blade stocker 210 and place the cutting blade 82 on the chassis 214 of the automated blade conveying vehicle 206. Specifically, the cutting blade 82 is placed on the blade case 216 indicated from the control unit 12 by the control signal (first conveyance instruction signal), for example.

When the conveyance of the cutting blade 82 to the automated blade conveying vehicle 206 has been completed, the control apparatus 32 generates a notification signal (first conveyance completion signal) for notifying that the conveyance of the cutting blade 82 to the automated blade conveying vehicle 206 has been completed. The notification signal (first conveyance completion signal) generated by the control apparatus 32 is transmitted from the transmitter 36 to the control unit 12.

When receiving the notification signal (first conveyance completion signal) transmitted from the transmitter 36 of the stock unit 208, the receiver 134 of the control unit 12 sends it to the control part 132. When checking the notification signal (first conveyance completion signal) from the stock unit 208, the control part 132 issues, to the automated blade conveying vehicle 206, an instruction to move to a position at which the cutting blade 82 can be transferred to the cutting apparatus 204 and wait. Specifically, the control part 132 generates a control signal (second wait instruction signal) equivalent to this instruction and sends it from the transmitter 136 to the automated blade conveying vehicle 206.

When receiving the control signal (second wait instruction signal) from the control unit 12, the receiver 222a of the automated blade conveying vehicle 206 sends it to the control apparatus 220. The control apparatus 220 controls operation of the wheels 218 and so forth based on this control signal (second wait instruction signal) and causes the automated blade conveying vehicle 206 to travel along the conveyance passage 6.

During traveling of the automated blade conveying vehicle 206, also, it is desirable to detect vibration of the chassis 214 or the like and record the vibration as vibration data by the vibration detection unit 224a. This makes it possible, for example, to detect an accident such as collision of the automated blade conveying vehicle 206. In addition, it becomes possible to confirm the state of the conveyance passage 6 in the course of movement of the automated blade conveying vehicle 206 to the vicinity of the cutting apparatus 204.

Similarly, the ambient environment of the automated blade conveying vehicle 206 or the conveyance passage 6 may be imaged, and an image picked up may be recorded, by the camera unit 224b. In this case, the status of the ambient environment of the automated blade conveying vehicle 206 or the conveyance passage 6 during traveling can be confirmed later. Note that the vibration data recorded in the vibration detection unit 224a and the picked-up image recorded in the camera unit 224b are transmitted from the transmitter 222b to the control unit 12, as required.

Upon receiving the vibration data or the like from the automated blade conveying vehicle 206, the receiver 134 of the control unit 12 sends it to the control part 132. The control part 132 determines occurrence of an accident such as collision, the state of the conveyance passage 6 or the like on the basis of the vibration data or the like received from the automated blade conveying vehicle 206.

For example, in the case where large vibration in excess of a first threshold is detected during traveling, the control part 132 determines that the conveyance passage 6 has ruggedness (projection and recess). Besides, for example, in the case where an extremely large vibration in excess of a second threshold greater than the first threshold is detected during traveling, the control part 132 determines that an accident such as collision of the automated blade conveying vehicle 206 has occurred.

In addition, for example, in the case where vibration of a comparatively long period is detected during traveling, the control part 132 determines that the conveyance passage 6 is not properly fixed in relation to the cutting apparatus 204. The results of determination are utilized, for example, for maintenance of the conveyance passage 6, selection of the cutting blade 82, and so on. Naturally, the control part 132 may notify the operator of the determination results by a beep sound, a warning lamp or the like. Besides, the control part 132 can stop the conveyance of the workpiece 11 or the cutting blade 82 on the basis of the determination results.

When confirming that the automated blade conveying vehicle 206 has moved to near the cutting apparatus 204, the control apparatus 220 stops the wheels 218 and so forth. Furthermore, the control apparatus 220 generates a notification signal (second standby signal) for notifying that the automated blade conveying vehicle 206 is waiting at a position at which the cutting blade 82 can be transferred to the cutting apparatus 204. The notification signal (second standby signal) generated by the control apparatus 220 is transmitted from the transmitter 222b to the control unit 12.

When receiving the notification signal (second standby signal) transmitted from the transmitter 222b of the automated blade conveying vehicle 206, the receiver 134 of the control unit 12 sends it to the control part 132. When checking the notification signal (second standby signal) from the automated blade conveying vehicle 206, the control part 132 issues, to the cutting apparatus 204, an instruction to convey the cutting blade 82 from the automated blade conveying vehicle 206. Specifically, the control part 132 generates a control signal (second conveyance instruction signal) equivalent to this instruction and sends it from the transmitter 136 to the cutting apparatus 204.

When receiving the control signal (second conveyance instruction signal) from the control unit 12, the receiver 98 of the cutting apparatus 204 sends it to the control apparatus 96. The control apparatus 96 controls operation of the blade conveying arm 230 and so forth based on this control signal (second conveyance instruction signal) to carry out the cutting blade 82 from the chassis 214 of the automated blade conveying vehicle 206 and transfer the cutting blade 82 to the blade holding part 228. Specifically, the cutting blade 82 in the blade case 216 indicated from the control unit 12 by the control signal (second conveyance instruction signal) is carried out to be transferred to the blade holding part 228.

When the transfer of the cutting blade 82 to the cutting apparatus 204 has been completed, the control apparatus 96 generates a notification signal (second conveyance completion signal) for notifying that the conveyance of the cutting blade 82 to the cutting apparatus 204 has been completed, for example. The notification signal (second conveyance completion signal) generated by the control apparatus 96 is transmitted from the transmitter 100 to the control unit 12. By such a procedure, the cutting blade 82 housed in the stock unit 208 can be conveyed to the cutting apparatus 204 according to need.

Thereafter, the cutting apparatus 204 transfers the cutting blade 82 from the above-described blade holding part 228 to the blade changer 232, for example. Then, by this blade changer 232, the cutting blade 82 received from the blade holding part 228 and the used cutting blade 82 that has been already mounted to the cutting unit 80 are replaced.

The used cutting blade 82 detached from the cutting unit 80 is transferred to the blade holding part 228. The blade conveying arm 230 places the used cutting blade 82 held by the blade holding part 228 on the chassis 214 of the automated blade conveying vehicle 206 that is waiting. At this time, the used cutting blade 82 is placed on the blade case 216 indicated by the control apparatus 96, for example.

When the conveyance of the used cutting blade 82 to the automated blade conveying vehicle 206 has been completed, the control apparatus 96 generates a notification signal (third conveyance completion signal) for notifying that the conveyance of the used cutting blade 82 to the automated blade conveying vehicle 206 has been completed. The notification signal (third conveyance completion signal) generated by the control apparatus 96 is transmitted from the transmitter 100 to the control unit 12. Information on the blade case 216 on which the used cutting blade 82 is placed (information of the information providing part 214b corresponding to the blade case 216) is included in this notification signal (third conveyance completion signal).

When receiving the notification signal (third conveyance completion signal) transmitted from the transmitter 100 of the cutting apparatus 204, the receiver 134 of the control unit 12 sends it to the control part 132. When checking the notification signal (third conveyance completion signal) from the cutting apparatus 204, the control part 132 issues, to the automated blade conveying vehicle 206, an instruction to move to a position at which the used cutting blade 82 can be transferred to the stock unit 208 and wait. Specifically, the control part 132 generates a control signal (third wait instruction signal) equivalent to this instruction and sends it from the transmitter 136 to the automated blade conveying vehicle 206.

When receiving the control signal (third wait instruction signal) from the control unit 12, the receiver 222a of the automated blade conveying vehicle 206 sends it to the control apparatus 220. The control apparatus 220 controls operation of the wheels 218 and so forth based on this control signal (third wait instruction signal) and causes the automated blade conveying vehicle 206 to travel along the conveyance passage 6.

During traveling of this automated blade conveying vehicle 206, also, it is desirable to detect vibration of the chassis 214 or the like and record the vibration as vibration data by the vibration detection unit 224a. This makes it possible, for example, to confirm the state of the conveyance passage 6 in the course of movement of the automated blade conveying vehicle 206 to the vicinity of the stock unit 208.

Similarly, the ambient environment of the automated blade conveying vehicle 206 or the conveyance passage 6 may be imaged, and an image picked up may be recorded, by the camera unit 224b. In this case, the status of the ambient environment of the automated blade conveying vehicle 206 or the conveyance passage 6 during traveling can be confirmed later. Specific operations of the components are the same as in the above case where the automated blade conveying vehicle 206 travels along the conveyance passage 6.

When confirming that the automated blade conveying vehicle 206 has moved to near the stock unit 208, the control apparatus 220 stops the wheels 218 and so forth. Furthermore, the control apparatus 220 generates a notification signal (third standby signal) for notifying that the automated blade conveying vehicle 206 is waiting at a position at which the used cutting blade 82 can be transferred. The notification signal (third standby signal) generated by the control apparatus 220 is transmitted from the transmitter 222b to the control unit 12.

When receiving the notification signal (third standby signal) transmitted from the transmitter 222b of the automated blade conveying vehicle 206, the receiver 134 of the control unit 12 sends it to the control part 132. When checking the notification signal (third standby signal) from the automated blade conveying vehicle 206, the control part 132 issues, to the stock unit 208, an instruction to carry out the used cutting blade 82 from the automated blade conveying vehicle 206. Specifically, the control part 132 generates a control signal (third conveyance instruction signal) equivalent to this instruction and sends it from the transmitter 136 to the stock unit 208.

When receiving the control signal (third conveyance instruction signal) from the control unit 12, the receiver 34 of the stock unit 208 sends it to the control apparatus 32. The control apparatus 32 controls operation of the blade conveying arm 212 and so forth based on this control signal (third conveyance instruction signal) to carry out the used cutting blade 82 from the chassis 214 of the automated blade conveying vehicle 206 and house the used cutting blade 82 to the blade stocker 210. Specifically, the cutting blade 82 in the blade case 216 indicated from the control unit 12 by the control signal (third conveyance instruction signal) is carried out to be transferred to the blade stocker 210.

By such a procedure, the cutting blade 82 housed in the stock unit 208 can be conveyed to the cutting apparatus 204 according to need. Furthermore, the used cutting blade 82 detached from the cutting unit 80 of the cutting apparatus 204 can be collected. Here, the automated blade conveying vehicle 206 is made to wait on the spot during work of replacing the cutting blade 82. However, for example, the cutting blade 82 may be conveyed to another cutting apparatus 204 during this work of replacing the cutting blade 82.

Furthermore, the above-described procedure can be changed within a range in which the cutting blade 82 can be properly conveyed. For example, plural steps included in the above-described procedure may be simultaneously executed and the order of the steps may be changed within a range in which no trouble is caused in the conveyance of the cutting blade 82. Similarly, an arbitrary step may be changed or omitted within a range in which no trouble is caused in the conveyance of the cutting blade 82.

As described above, the conveyance system 202 according to the present embodiment includes the conveyance passage 6 set across plural cutting apparatuses (processing apparatuses) 204, the automated blade conveying vehicle 206 including the chassis (blade support part) 214, the wheels (traveling mechanism) 218, and the receiver 222a, and the stock unit 208 including the blade conveying arm (blade conveying part) 212 and the receiver 34.

Thus, the cutting blade 82 can be conveyed to each of the plural cutting apparatuses 204 by conveying the cutting blade 82 housed in the blade stocker 210 to the chassis 214 of the automated blade conveying vehicle 206 by the blade conveying arm 212 and causing this automated blade conveying vehicle 206 to travel on the conveyance passage 6. Furthermore, in the conveyance system 202 according to the present embodiment, the conveyance passage 6 is set in a space directly above the cutting apparatus 204. For this reason, the structures of the side surfaces of each cutting apparatus 204 do not need to be considered when this conveyance passage 6 is designed. That is, construction of the conveyance system 202 becomes easy.

Further, the automated blade conveying vehicle 206 according to the present embodiment includes the vibration detection unit 224a that detects vibration of the chassis 214 and record the vibration as vibration data, in addition to the chassis 214, the wheels 218 and the receiver 222a. Therefore, it is possible to detect an accident such as collision, and to determine the state of the conveyance passage 6 on the basis of the vibration detected by the vibration detection unit 224a. In addition, since the automated blade conveying vehicle 206 according to the present embodiment includes the camera unit 224b that images the ambient environment or the conveyance passage 6 and records the picked-up image, the status of the ambient environment of the automated blade conveying vehicle 206 or the conveyance passage 6 can be confirmed later.

Embodiment 3

In the present embodiment, an example in which a conveyance mechanism for conveying the cassette 28 (workpiece 11) to a cutting apparatus is attached to a conveyance passage will be described. The basic configuration of the cutting apparatus and the conveyance passage is the same as embodiments 1 and 2. Thus, a common constituent element is given the same numeral, and the detailed description is omitted.

Figure 21:
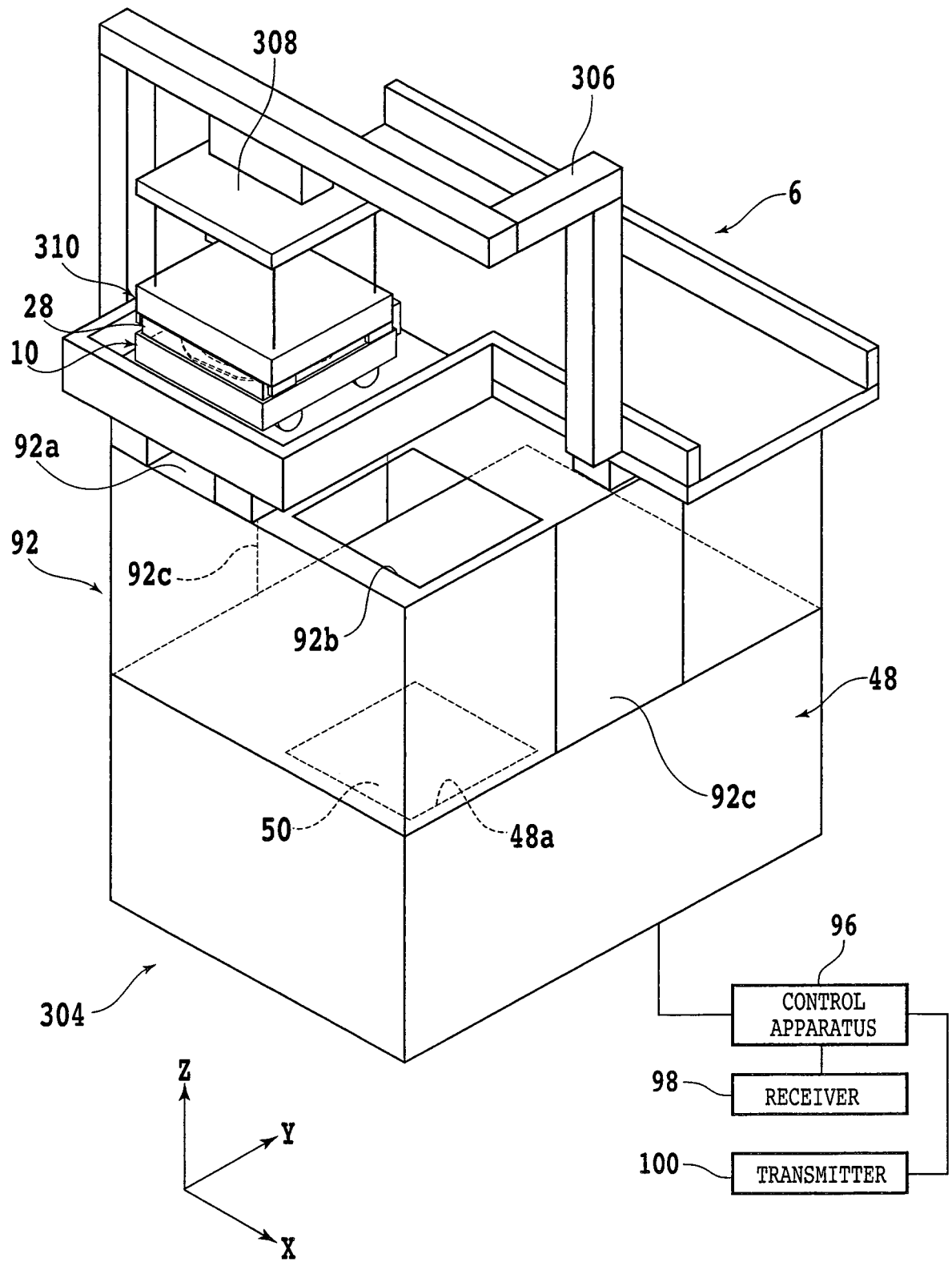
FIG. 21 is a perspective view schematically illustrating how the cassette is carried out from the automated workpiece conveying vehicle in a conveyance system according to Embodiment 3.
Figure 22:
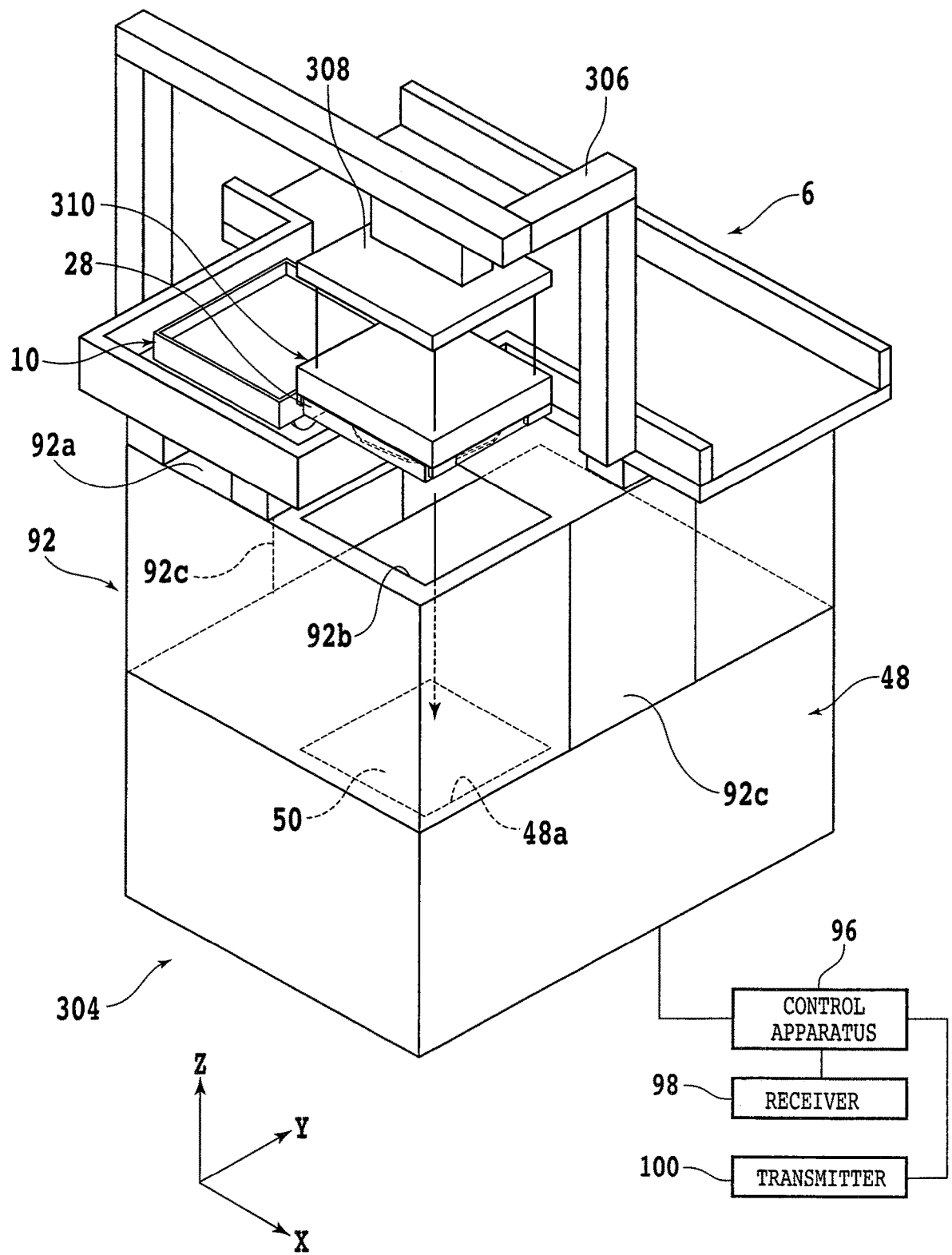
FIG. 22 is a perspective view schematically illustrating how the cassette is carried in to the cutting apparatus in the conveyance system according to Embodiment 3.

FIG. 21 is a perspective view schematically illustrating how the cassette 28 is carried out from the automated workpiece conveying vehicle 10 in a conveyance system according to the present embodiment. FIG. 22 is a perspective view schematically illustrating how the cassette 28 is carried in to a cutting apparatus (processing apparatus) 304. In FIG. 21 and FIG. 22, the constituent elements inside the cover 92 are all omitted.

As illustrated in FIG. 21 and FIG. 22, the cutting apparatus 304 used in the present embodiment is not equipped with the cassette conveying arm 94. Furthermore, in this cutting apparatus 304, the upper surface of the cassette support base 50 does not need to be exposed to the outside of the cover 92. Meanwhile, a support structure 306 is fixed to the conveyance passage 6 on the cutting apparatus 304.

A movement mechanism 308 that moves in the horizontal direction is disposed on the support structure 306. A cassette holding hand 310 that holds the cassette 28 is disposed at the lower end part of the movement mechanism 308. The cassette holding hand 310 is connected to the movement mechanism 308 in a manner capable of moving up and down like a crane, for example. Furthermore, a camera used in checking whether or not the cassette 28 is present, the position of the cassette 28, and so forth is disposed on the lower surface side of the cassette holding hand 310.

When the cassette 28 is conveyed from the automated workpiece conveying vehicle 10 to the cutting apparatus 304 in this conveyance system, first, the movement mechanism 308 is positioned above the automated workpiece conveying vehicle 10 that is waiting near the cutting apparatus 304. Next, as illustrated in FIG. 21, the cassette holding hand 310 is lowered, and the cassette 28 on the automated workpiece conveying vehicle 10 is held by this cassette holding hand 310.

Thereafter, the cassette holding hand 310 is raised. Furthermore, the movement mechanism 308 is moved to above the opening 92b of the cover 92 (i.e. above the cassette support base 50). Then, as illustrated in FIG. 22, the cassette holding hand 310 is lowered and the cassette 28 held by this cassette holding hand 310 is placed on the upper surface of the cassette support base 50. By the above-described procedure, the cassette 28 can be conveyed from the automated workpiece conveying vehicle 10 to the cutting apparatus 304.

In the conveyance system of the present embodiment, the conveyance mechanism for conveying the cassette 28 (workpiece 11) to the cutting apparatus 304 is attached to the conveyance passage 6. Therefore, the cutting apparatus 304 does not need to be equipped with a cassette conveying arm. Thus, the general versatility of the conveyance system becomes higher compared with the case in which the cutting apparatus is equipped with the cassette conveying arm, or the like.

The present invention is not limited to the description of the above embodiments and can be carried out with various changes. For example, the cutting apparatus 204 of the above embodiment is equipped with the blade raising-lowering mechanism 226 for raising and lowering the cutting blade 82. However, a blade raising-lowering mechanism may be attached to the conveyance passage 6. In this case, the general versatility of the conveyance system becomes higher compared with the case in which the cutting apparatus is equipped with the blade raising-lowering mechanism, or the like.

Furthermore, the conveyance passage 6 may have a space (waiting region) for allowing two automated workpiece conveying vehicles 10 or the like to pass each other. In addition, the conveyance passage 6 may be set as a so-called one-way passage on which only traveling of the automated workpiece conveying vehicle 10 or the like in one direction is permitted. In this case, the conveyance passage 6 for outward traveling and the conveyance passage 6 for homeward traveling may be set on a cutting apparatus (processing apparatus).

Moreover, in the above embodiments, the information providing part 102b such as an identification code or wireless tag is set on the passage part 102. However, it is also possible to attach an information providing part to the guide part 104. In this case, it is preferable to attach the information providing part to a wall surface of the inside of the guide part 104, the upper end part of the guide part 104, or the like, for example.

Besides, structures, methods, and so forth relating to the above embodiments, modification examples, and so forth can be implemented with appropriate changes without departing from the range of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An automated workpiece conveying vehicle included in a conveyance system that conveys a workpiece to each of a plurality of processing apparatuses, the automated workpiece conveying vehicle comprising:
    a workpiece support part that supports the workpiece;
    a traveling mechanism that is provided on the workpiece support part;
    a vibration detection unit that detects vibration of the workpiece support part and records the vibration as vibration data; and
    a receiver that receives a control signal transmitted from a control unit included in the conveyance system, the control signal instructing conveyance of the workpiece to the processing apparatus.

2. The automated workpiece conveying vehicle according to claim 1, wherein
    the conveyance system includes a conveyance passage set in a space directly above the processing apparatus across a plurality of the processing apparatuses, and the automated workpiece conveying vehicle detects vibration when traveling on the conveyance passage and records the vibration as the vibration data by the vibration detection unit.

3. The automated workpiece conveying vehicle according to claim 2, further comprising:
    a camera unit that images an ambient environment or the conveyance passage and records an image picked up.

4. The automated workpiece conveying vehicle according to claim 3, further comprising:
a transmitter that transmits the vibration data or the picked-up image to the control unit.

* * * * *